US011482528B2

(12) United States Patent
Thareja et al.

(10) Patent No.: US 11,482,528 B2
(45) Date of Patent: Oct. 25, 2022

(54) PILLAR CAPACITOR AND METHOD OF FABRICATING SUCH

(71) Applicant: Kepler Computing Inc., San Francisco, CA (US)

(72) Inventors: Gaurav Thareja, Santa Clara, CA (US); Sasikanth Manipatruni, Portland, OR (US); Rajeev Kumar Dokania, Beaverton, OR (US); Ramamoorthy Ramesh, Moraga, CA (US); Amrita Mathuriya, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 173 days.

(21) Appl. No.: 16/729,278

(22) Filed: Dec. 27, 2019

(65) Prior Publication Data

US 2021/0202507 A1 Jul. 1, 2021

(51) Int. Cl.
*H01L 27/11502* (2017.01)
*H01L 49/02* (2006.01)
*G11C 11/22* (2006.01)

(52) U.S. Cl.
CPC ...... *H01L 27/11502* (2013.01); *G11C 11/221* (2013.01); *H01L 28/40* (2013.01)

(58) Field of Classification Search
None
See application file for complete search history.

(56) References Cited

U.S. PATENT DOCUMENTS

| 5,479,317 | A | 12/1995 | Ramesh |
| 5,519,235 | A | 5/1996 | Ramesh |
| 5,651,857 | A | 7/1997 | Cronin et al. |
| 5,716,875 | A | 2/1998 | Jones, Jr. et al. |
| 5,777,356 | A | 7/1998 | Dhote et al. |
| 6,066,868 | A | 5/2000 | Evans, Jr. |
| 6,115,281 | A | 9/2000 | Aggarwal et al. |
| 6,117,688 | A | 9/2000 | Evans, Jr. et al. |
| 6,194,754 | B1 | 2/2001 | Aggarwal et al. |

(Continued)

FOREIGN PATENT DOCUMENTS

| JP | 10242426 | 9/1998 |
| TW | 200403814 A | 3/2004 |

(Continued)

OTHER PUBLICATIONS

Chandler, T. "An adaptive reference generation scheme for 1T1C FeRAMs", 2003 Symposium on VLSI Circuits. Digest of Technical Papers (IEEE Cat. No. 03CH37408), Kyoto, Japan, 2003, pp. 173-174.

(Continued)

*Primary Examiner* — Steven M Christopher
(74) *Attorney, Agent, or Firm* — Mughal IP P.C.

(57) ABSTRACT

The memory bit-cell formed using the ferroelectric capacitor results in a taller and narrower bit-cell compared to traditional memory bit-cells. As such, more bit-cells can be packed in a die resulting in a higher density memory that can operate at lower voltages than traditional memories while providing the much sought after non-volatility behavior. The pillar capacitor includes a plug that assists in fabricating a narrow pillar.

12 Claims, 13 Drawing Sheets

(56) References Cited

U.S. PATENT DOCUMENTS

| | | | |
|---|---|---|---|
| 6,211,035 B1* | 4/2001 | Moise | H01L 21/31116 |
| | | | 257/E21.252 |
| 6,274,388 B1 | 8/2001 | Aggarwal et al. | |
| 6,344,413 B1* | 2/2002 | Zurcher | H01L 21/3212 |
| | | | 438/387 |
| 6,346,741 B1 | 2/2002 | Buskirk et al. | |
| 6,440,815 B1 | 8/2002 | Mitsuhashi | |
| 6,587,367 B1 | 7/2003 | Nishimura et al. | |
| 6,656,748 B2 | 12/2003 | Hall et al. | |
| 6,713,342 B2 | 3/2004 | Celii et al. | |
| 6,720,600 B2 | 4/2004 | Okita | |
| 6,728,128 B2 | 4/2004 | Nishimura et al. | |
| 7,029,925 B2 | 4/2006 | Celii et al. | |
| 7,435,683 B2 | 10/2008 | Kavalieros et al. | |
| 7,935,543 B2* | 5/2011 | Moise, IV | H01L 27/11507 |
| | | | 257/295 |
| 8,183,109 B2* | 5/2012 | Izumi | H01L 27/11507 |
| | | | 438/396 |
| 8,362,533 B2 | 1/2013 | Ozaki | |
| 9,991,270 B2 | 6/2018 | Wang | |
| 11,289,497 B2 | 3/2022 | Thareja et al. | |
| 2003/0119211 A1 | 6/2003 | Summerfelt et al. | |
| 2004/0135182 A1 | 7/2004 | An et al. | |
| 2008/0038846 A1 | 2/2008 | Park et al. | |
| 2008/0224194 A1 | 9/2008 | Sashida | |
| 2009/0008743 A1 | 1/2009 | Lee et al. | |
| 2009/0298201 A1 | 12/2009 | Nagai | |
| 2010/0320518 A1 | 12/2010 | Ozaki | |
| 2012/0107965 A1* | 5/2012 | Sashida | H01L 21/7687 |
| | | | 257/E21.008 |
| 2013/0264620 A1* | 10/2013 | Yu | H01L 27/11509 |
| | | | 438/653 |
| 2015/0072441 A1 | 3/2015 | Sun | |
| 2016/0225423 A1 | 8/2016 | Naik et al. | |
| 2017/0287920 A1* | 10/2017 | Wang | H01L 21/76897 |
| 2019/0027535 A1 | 1/2019 | Kumar et al. | |
| 2019/0259807 A1 | 8/2019 | Kumar et al. | |
| 2020/0105772 A1 | 4/2020 | Chen et al. | |
| 2021/0202507 A1 | 7/2021 | Thareja et al. | |
| 2021/0202690 A1 | 7/2021 | Thareja et al. | |

FOREIGN PATENT DOCUMENTS

| | | |
|---|---|---|
| TW | 201241936 A | 10/2012 |
| TW | 201526206 A | 7/2015 |
| TW | 201715707 A | 5/2017 |
| TW | 201830585 A | 8/2018 |
| TW | 201830664 A | 8/2018 |
| TW | 201915624 A | 4/2019 |
| TW | 201917870 A | 5/2019 |
| TW | 201946052 A | 12/2019 |
| TW | 201946218 A | 12/2019 |
| WO | 2012078162 | 6/2012 |

OTHER PUBLICATIONS

Jung, D. et al., "Highly manufacturable 1T1C 4 Mb FRAM with novel sensing scheme," International Electron Devices Meeting 1999. Technical Digest (Cat. No. 99CH36318), Washington, DC, USA, 1999, pp. 279-282., International Electron Devices Meeting 1999. Technical Digest (Cat. No. 99CH36318), Washington, DC, USA, 1999, pp. 279-282.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Ogiwara, R. et al., "A 0.5-/spl mu/m, 3-V 1T1C, 1-Mbit FRAM with a variable reference bit-line voltage scheme using a fatigue-free reference capacitor", in IEEE Journal of Solid-State Circuits, vol. 35, No. 4, pp. 545-551, Apr. 2000.

Oh, S. et al. "Noble FeRAM technologies with MTP cell structure and BLT ferroelectric capacitors", IEEE International Electron Devices Meeting 2003, Washington, DC, USA, 2003, pp. 34.5.1-34.5.4.

Subbarao, E. "Ferroelectric and antiferroelectric materials", Department of Metallurgical Engineering, Indian Institute of Technology, Kanpur, IN. First published Mar. 15, 2011. Ferroelectrics, 5:1, 267-280.

Tanaka, S. et al., "FRAM cell design with high immunity to fatigue and imprint for 0.5 /spl mu/m 3 V 1T1C 1 Mbit FRAM", in IEEE Transactions on Electron Devices, vol. 47, No. 4, pp. 781-788, Apr. 2000.

Yamaoka, K. et al., "A 0.9-V 1T1C SBT-based embedded nonvolatile FeRAM with a reference voltage scheme and multilayer shielded bit-line structure", in IEEE Journal of Solid-State Circuits, vol. 40, No. 1, pp. 286-292, Jan. 2005.

International Search Report & Written Opinion dated Apr. 15, 2021 for PCT Patent Application No. PCT/US2020/066950.

International Search Report & Written Opinion dated Apr. 21, 2021 for PCT Patent Application No. PCT/US2020/066955.

Non-Final Office Action dated Jul. 8, 2021 for U.S. Appl. No. 16/729,267.

Office Action dated Sep. 6, 2021 for Taiwan Patent Application No. 109146060.

Restriction Requirement dated Mar. 26, 2021 for U.S. Appl. No. 16/729,267.

International Search Report & Written Opinion dated Apr. 22, 2021 for PCT Patent Application No. PCT/US2020/066958.

Non-Final Office Action dated Aug. 3, 2021 for Taiwanese Patent Application No. 109146059.

Non-Final Office Action dated Oct. 28, 2021 for U.S. Appl. No. 16/795,04.

Office Action dated Nov. 2, 2021 for Taiwan Patent Application No. 109146058.

Final Office Action dated Mar. 9, 2022 for U.S. Appl. No. 16/795,404.
Notice of Allowance dated Jan. 5, 2022 for U.S. Appl. No. 16/729,273.
Notice of Allowance dated Mar. 11, 2022 for U.S. Appl. No. 16/729,267.

Second Office Action dated Feb. 21, 2022 for Taiwan Patent Application No. 109146058.

Second Office Action dated Mar. 10, 2022 for Taiwan Patent Application No. 109146059.

Advisory Action notified May 20, 2022 for U.S. Appl. No. 17/795,404.
Non Final Office Action notified Jun. 8, 2022 for U.S. Appl. No. 16/729,267.

Notice of Allowance (2) notified Jun. 27, 2022 for U.S. Appl. No. 16/729,267.

International Preliminary Report on Patentability notified Jul. 7, 2022 for PCT Patent Application No. PCT/US2020/066950.
International Preliminary Report on Patentability notified Jul. 7, 2022 for PCT Patent Application No. PCT/2020/066958.
International Preliminary Report on Patentability notified Jul. 7, 2022 for PCT Patent Application No. PCT/US2020/066955.
Notice of Allowance notified Apr. 28, 2022 for Taiwan Patent Application No. 109146060.
Notice of Allowance notified May 24, 2022 for Taiwan Patent Application No. 109146058.
Second Office Action notified Apr. 11, 2022 for TW Patent Application No. 109146059.
Non-Final Office Action notified Aug. 18, 2022 for U.S. Appl. No. 16/795,404.
Notice of Allowance notified Aug. 29, 2022 for Taiwan Patent Application No. 109146059.

* cited by examiner

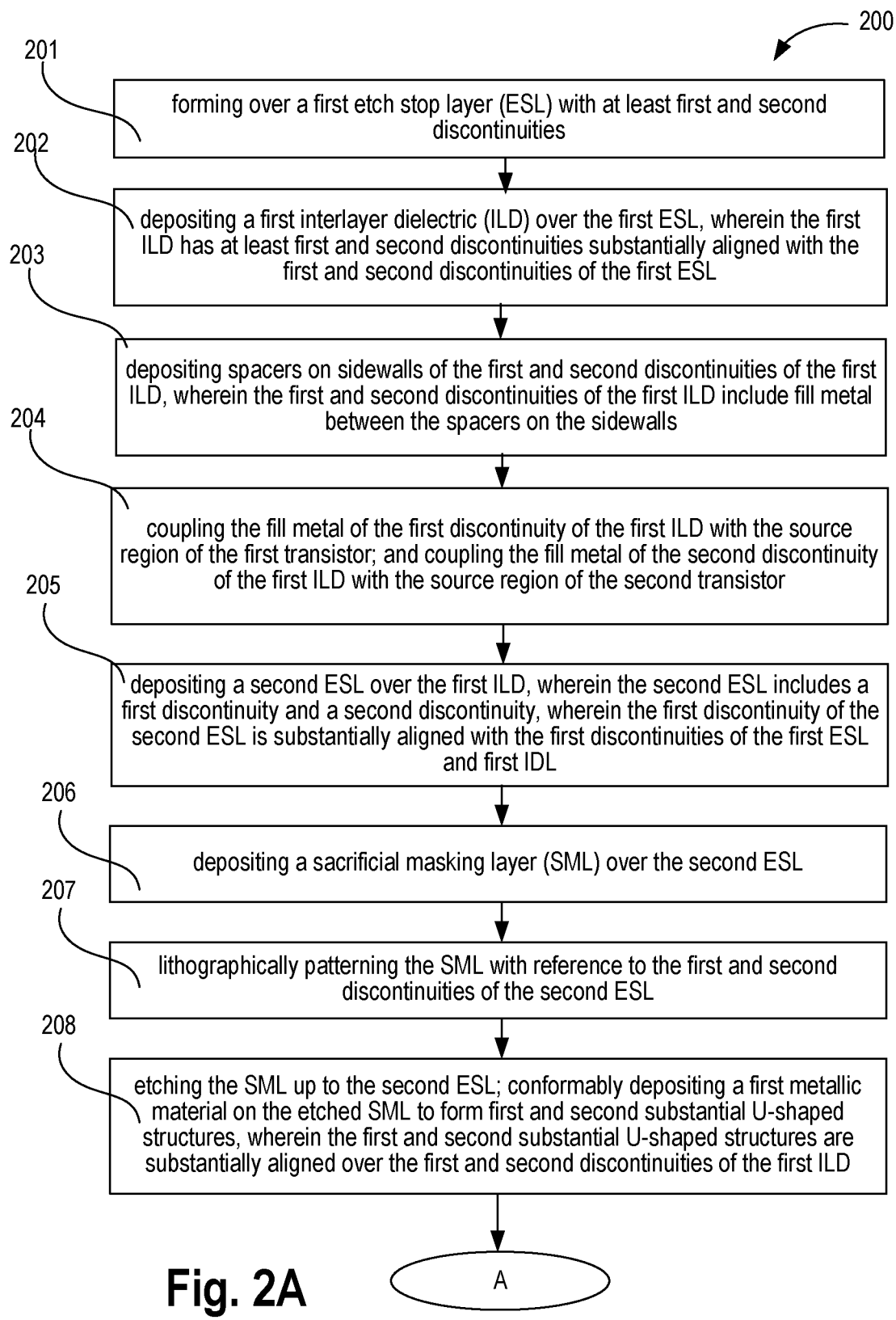

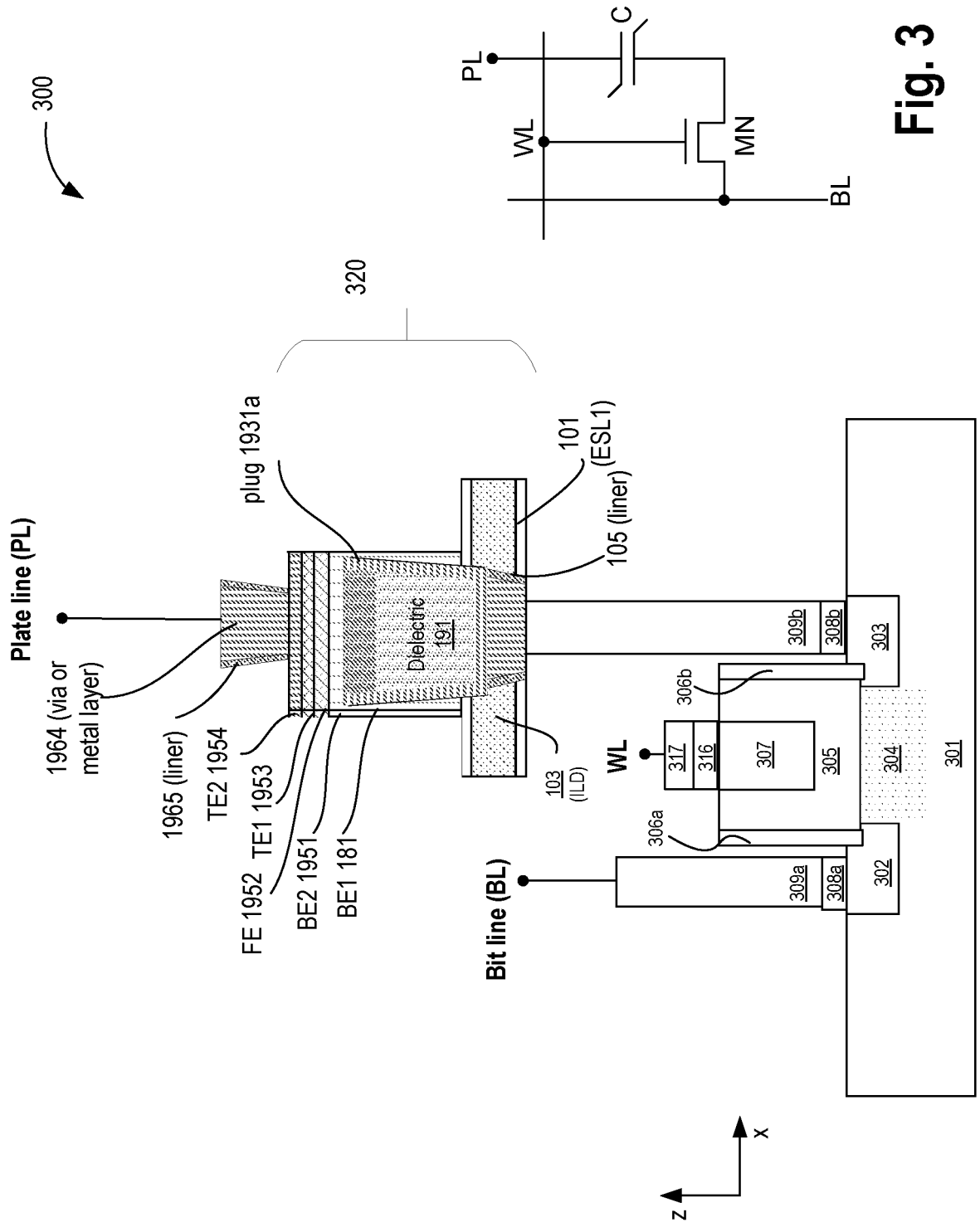

PILLAR CAPACITOR AND METHOD OF FABRICATING SUCH

BACKGROUND

The standard memory used in processors is static random-access memory (SRAM) or dynamic random access memory (DRAM), and their derivatives. These memories are volatile memories. For example, when power to the memories is turned off, the memories lose their stored data. Non-volatile memories are now also commonly used in computing platforms to replace magnetic hard disks. Non-volatile memories retain their stored data for prolonged periods (e.g., months, years, or forever) even when power to those memories is turned off. Examples of non-volatile memories are magnetic random-access memory (MRAM), NAND or NOR flash memories. These memories may not be suitable for low power and compact computing devices because these memories suffer from high write energy, low density, and high-power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2A-B illustrate flowcharts, respectively, of a method of patterning or fabricating ferroelectric pillar capacitor, in accordance with some embodiments.

FIG. 3 illustrates a 1T-1C (one transistor, one capacitor) bit-cell comprising the ferroelectric pillar capacitor of various embodiments.

DETAILED DESCRIPTION

Figure 1A:
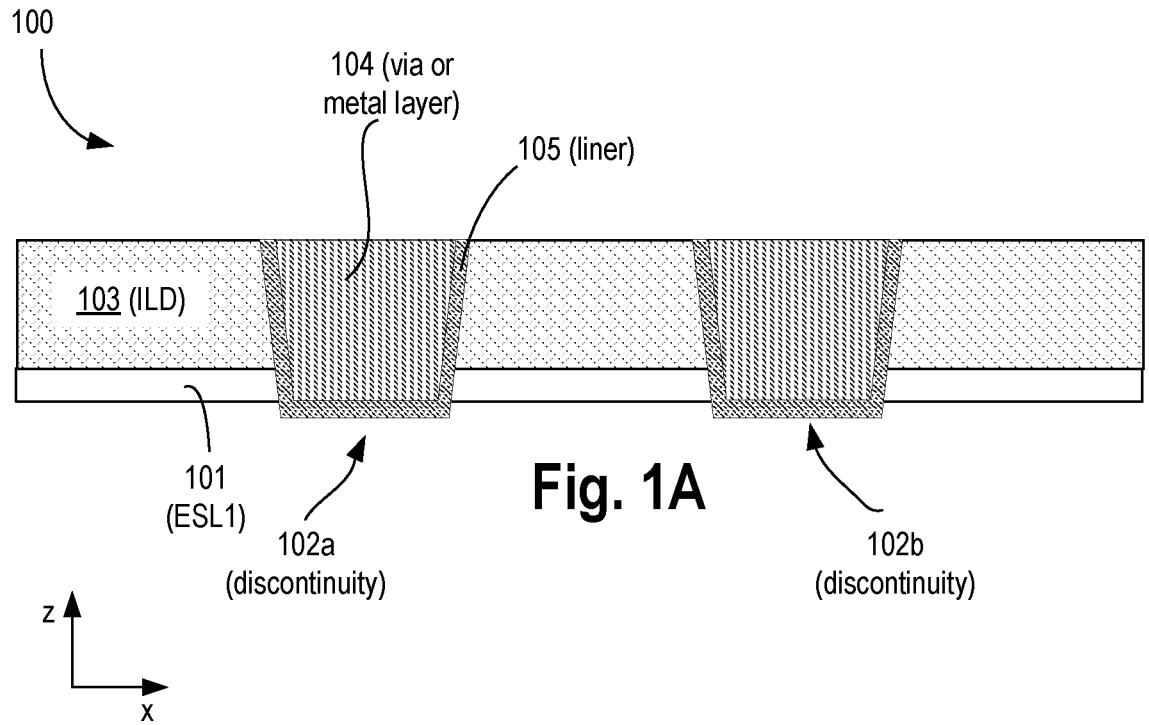
FIGS. 1A-P illustrate cross-sections, respectively, of processes of patterning or fabricating ferroelectric pillar capacitor, in accordance with some embodiments.
Figure 1B:
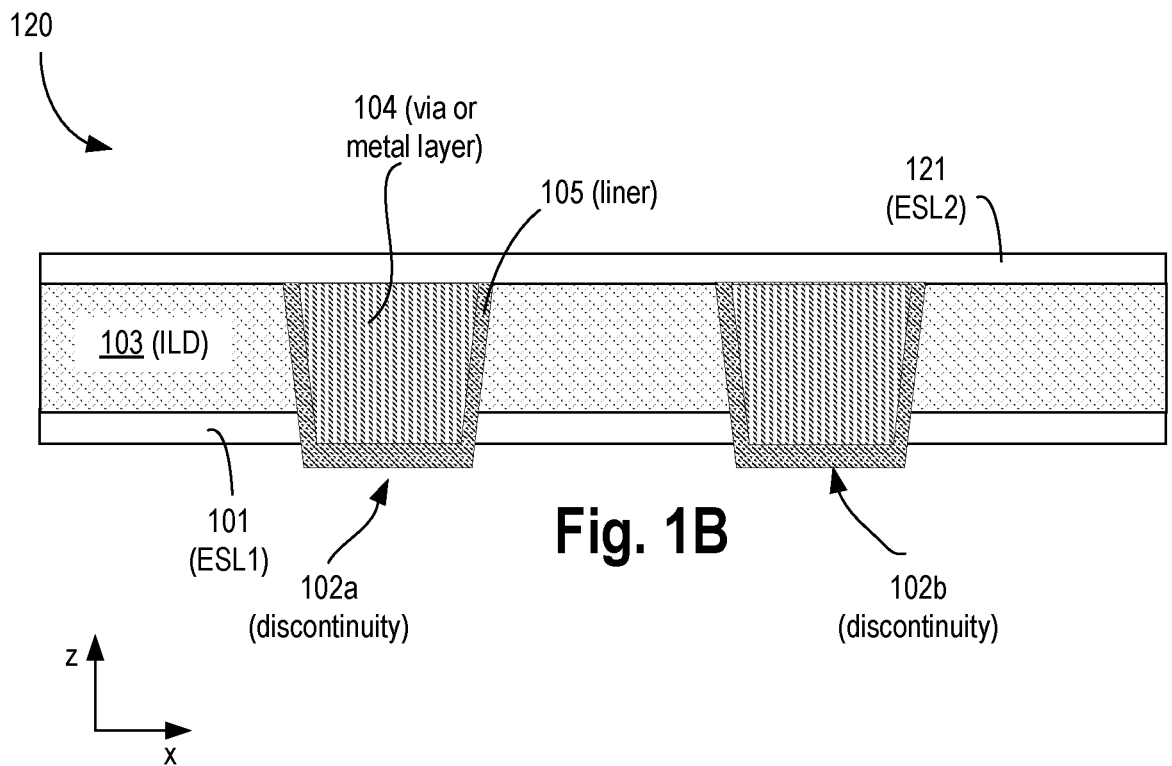
Figure 1C:
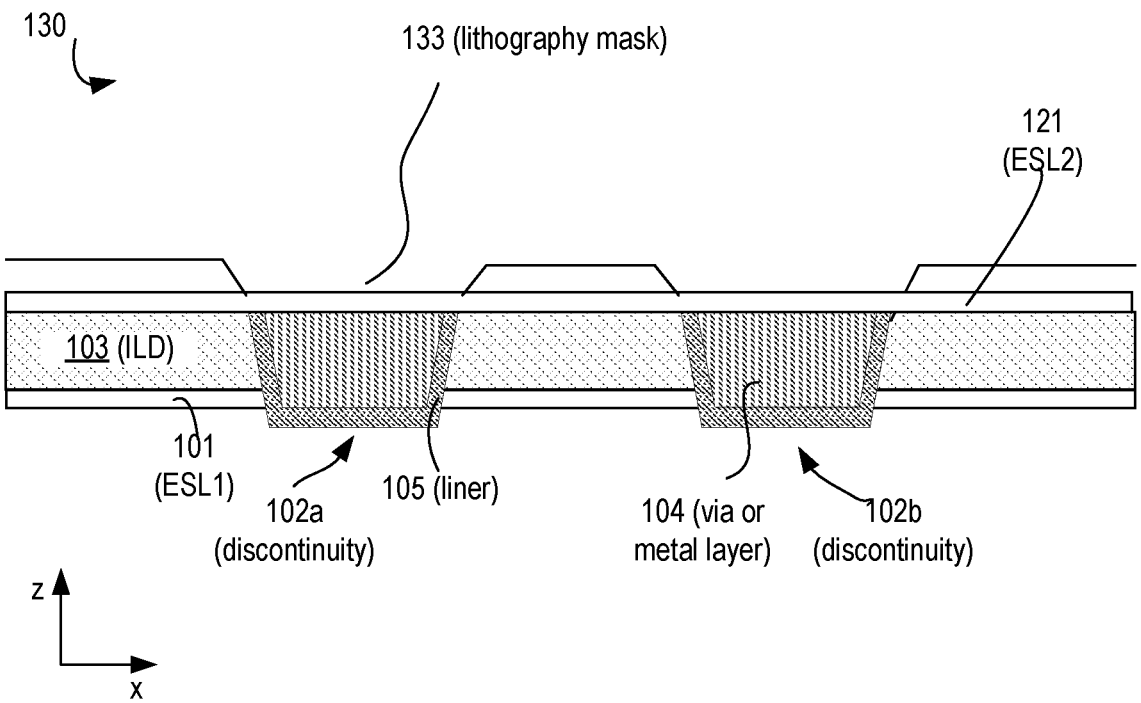
Figure 1D:
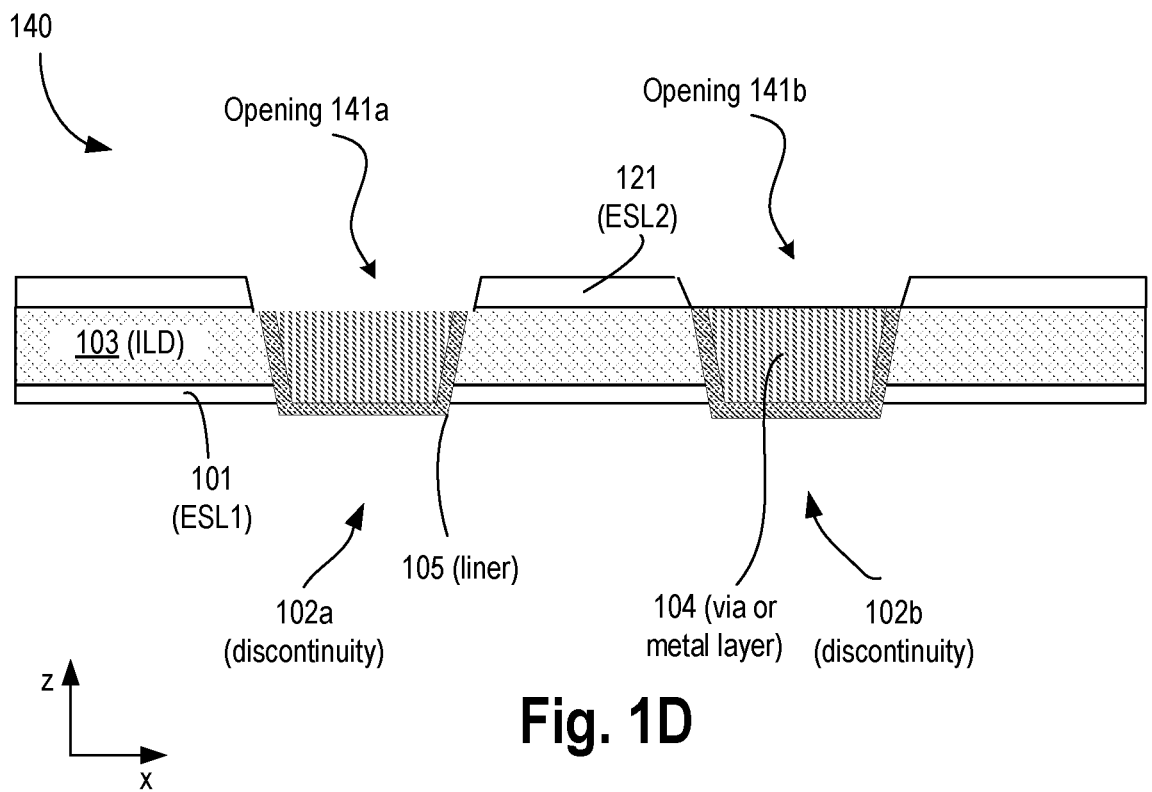
Figure 1E:
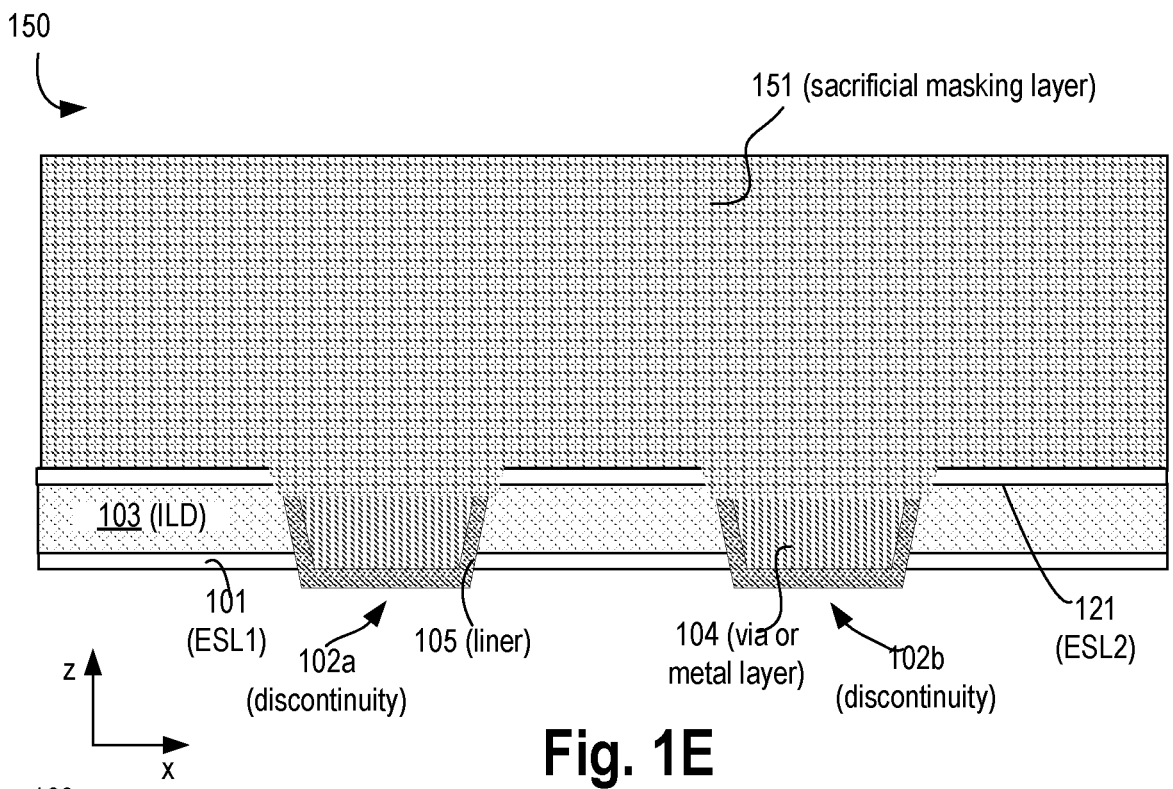
Figure 1F:
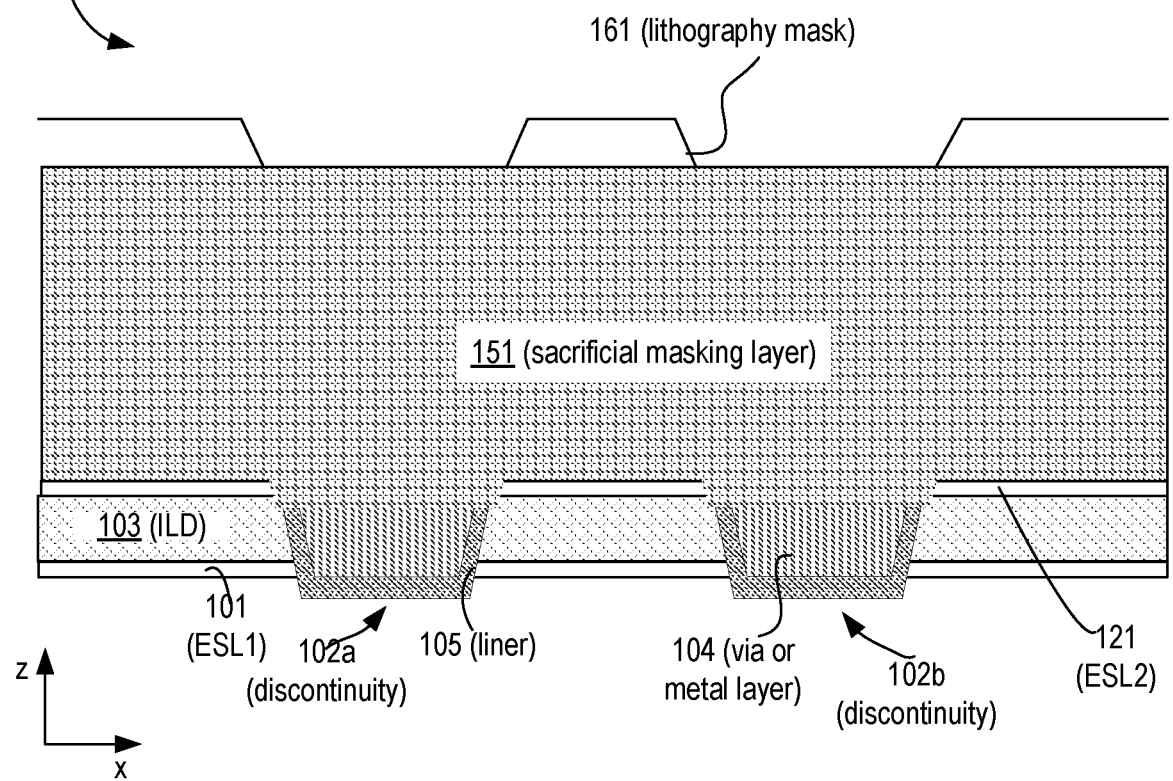
Figure 1G:
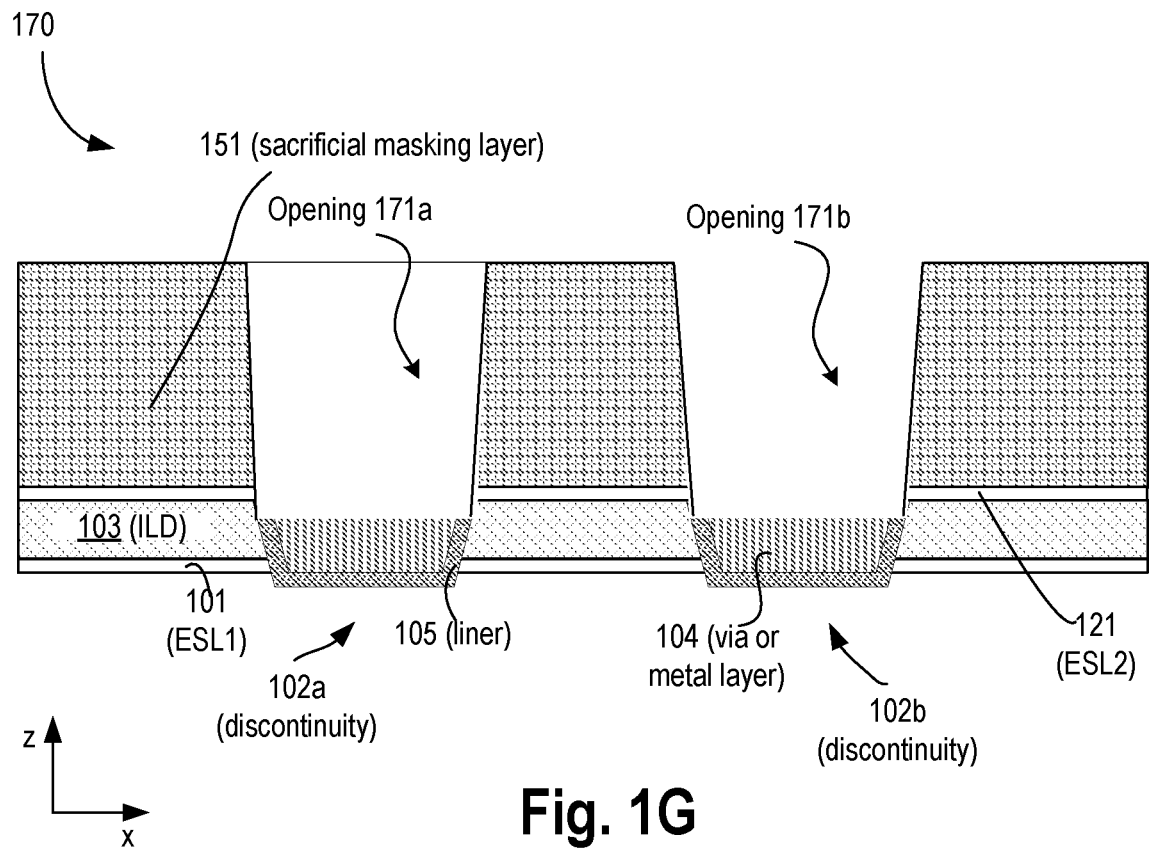
Figure 1H:
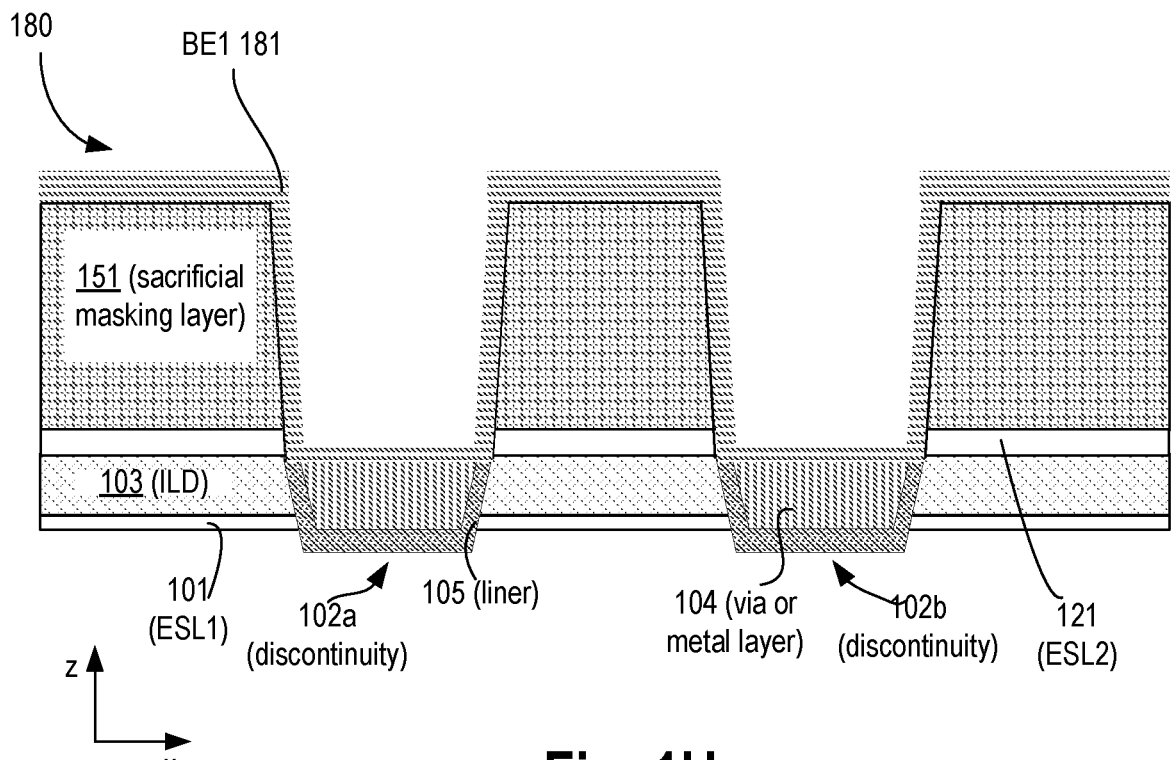
Figure 1I:
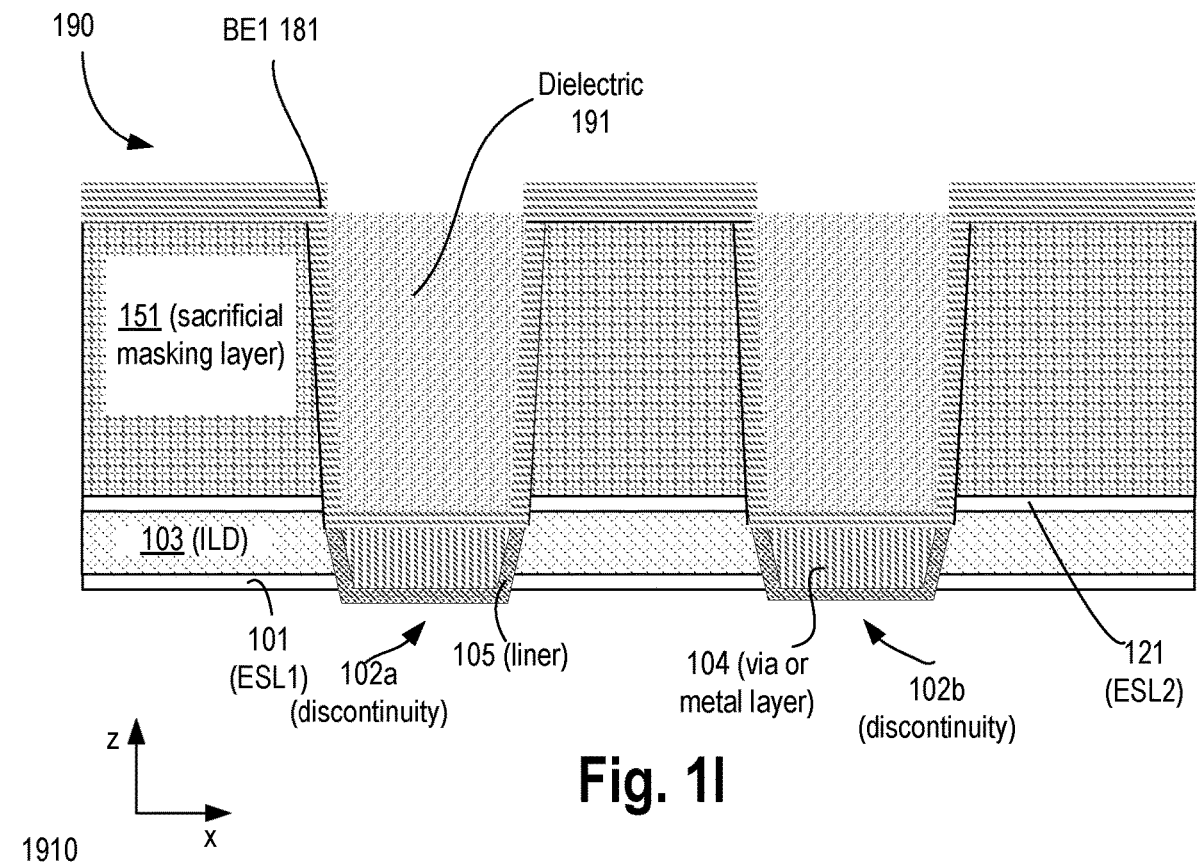
Figure 1J:
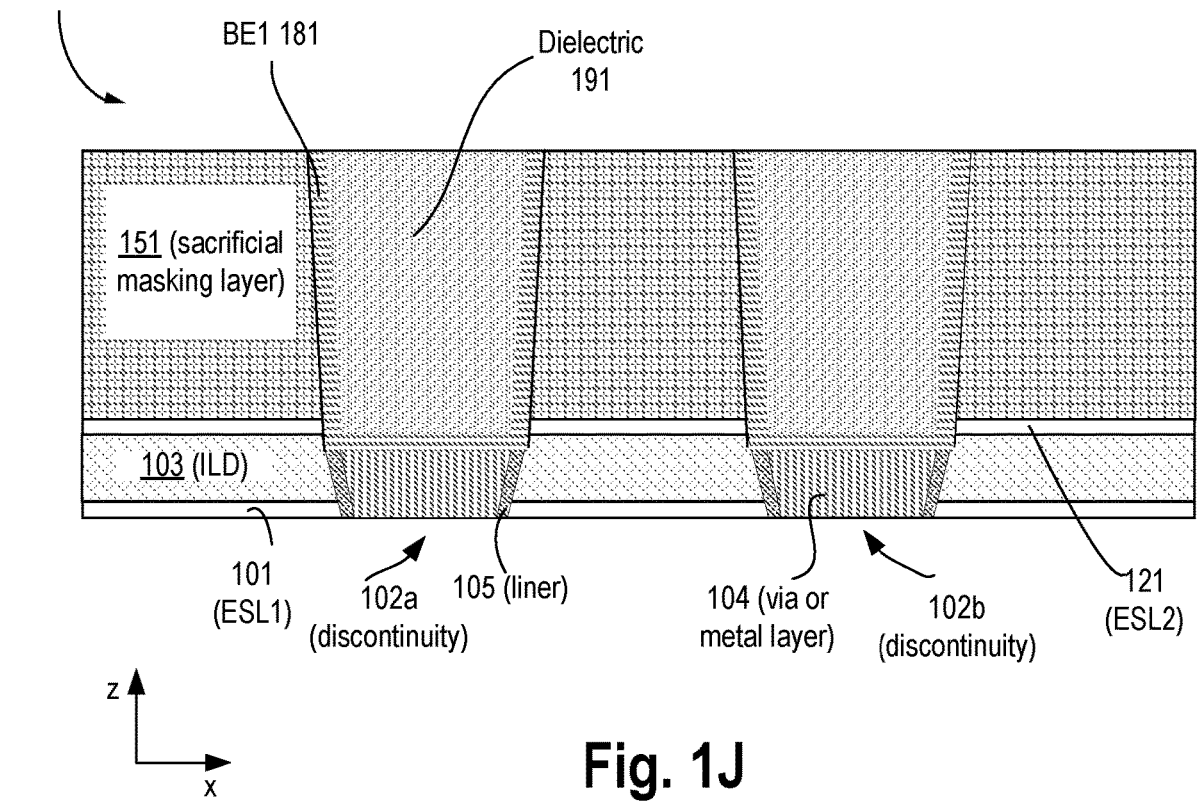
Figure 1K:
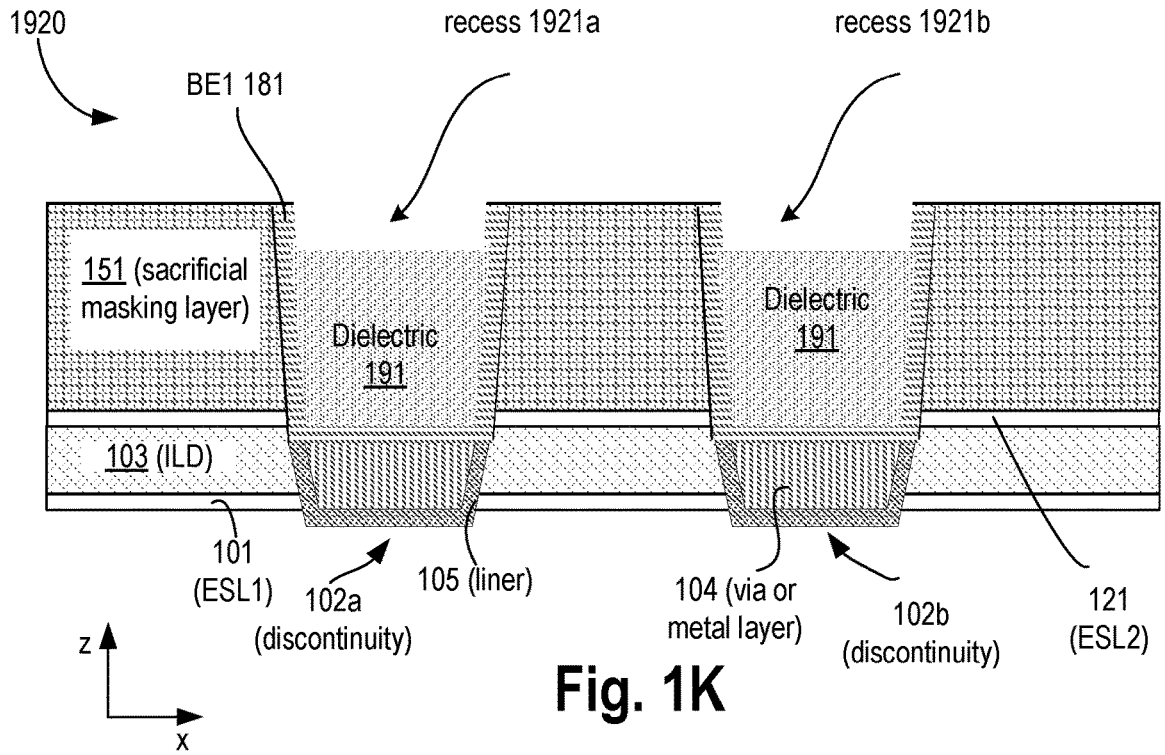
Figure 1L:
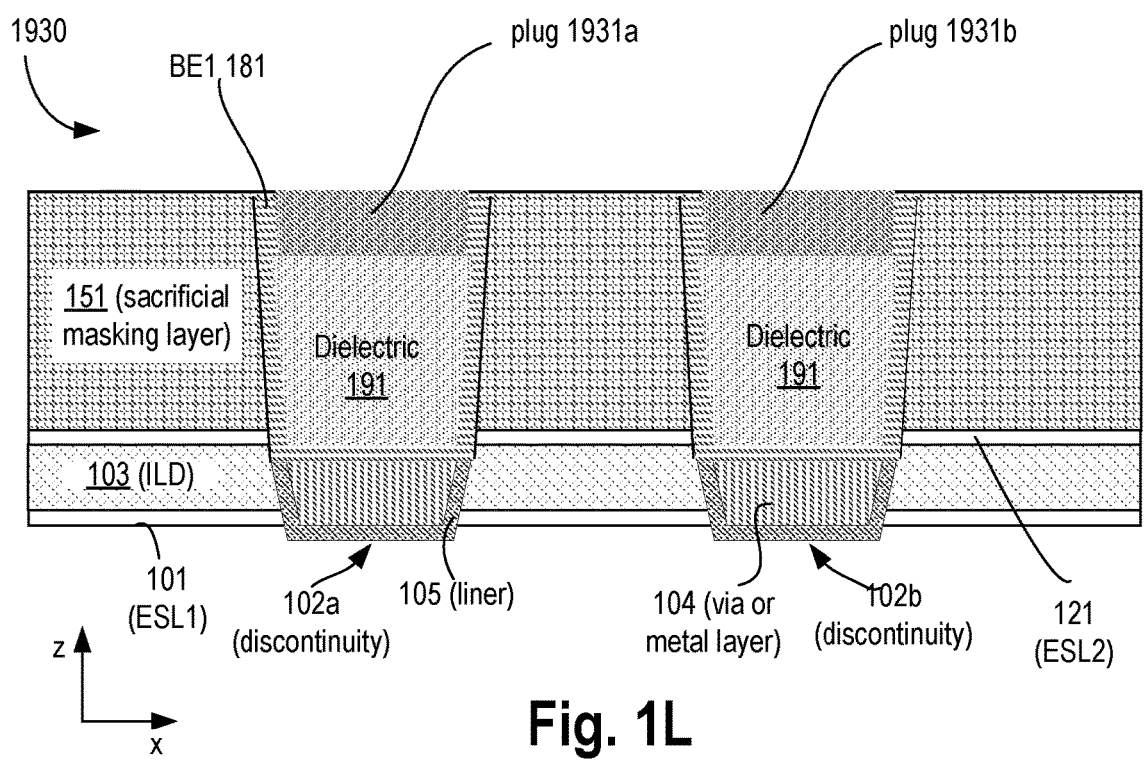

Some embodiments describe a pillar ferroelectric capacitor. The pillar ferroelectric capacitor is used in a memory. For example, in a 1T-1C (one transistor one capacitor) configuration, the capacitor comprises a tall pillar ferroelectric capacitor. The 1T-1C is part of a random-access memory (RAM) which comprises a transistor, which can be a planar or non-planar transistor. The memory further comprises an etch stop layer (ESL) and a pillar capacitor coupled the transistor. The pillar capacitor comprises a first electrode comprising first conductive material, wherein the first electrode forms substantially a U-shaped structure. The first electrode is the first bottom electrode (BE1). The U-shaped structure is filled with a first dielectric. In some embodiments, the memory further comprises a first structure, separate and different from the first dielectric, wherein the first structure is adjacent to the first dielectric such that the first structure plugs the U-shaped structure. The remaining layers of the ferroelectric capacitor are conformably deposited over the first structure plug and the ESL.

For example, a second electrode is deposited comprising second conductive material, wherein the second electrode is conformably adjacent to the first electrode. The second electrode is a second BE (BE2). A ferroelectric (FE) material is then conformably deposited adjacent to the second electrode. The top electrode (TE) is then formed over the FE material. A third electrode is conformably deposited adjacent to the ferroelectric material, wherein a portion of the second electrode is adjacent to the ESL. The third electrode is a first top electrode (TE1). In some embodiments, an additional top electrode (e.g., fourth electrode TE2) is conformably deposited over the third electrode.

The fourth electrode is then coupled to a plate-line (PL) while the metal layer (e.g., fill metal) coupled to the first bottom electrode is coupled to a source/drain terminal of the transistor. The gate of the transistor is coupled to word-line (WL), while the drain/source terminal of the transistor is coupled to a bit-line (BL). In some embodiments, the electrodes directly adjacent to the FE material comprise conductive oxides.

While two electrodes are assumed for the top electrode, any number of layers can be stacked to form a multi-layer top electrode. The same applies to the bottom electrode. For example, the top and/or bottom electrodes may comprise a single layer or multiple layers. The number of layers for the top and bottom electrodes may be the same or different.

There are many technical effects of various embodiments. For example, the process of forming the ferroelectric capacitor makes sure that ferroelectric capacitor is protected as it is integrated with a transistor. A memory bit-cell formed using the ferroelectric capacitor allows for very low voltage switching (e.g., 100 mV) of a ferroelectric (FE) state in the ferroelectric capacitor. The ferroelectric capacitor can be used with any type of transistor. For example, the ferroelectric capacitor of various embodiments can be used with planar or non-planar transistors. The transistors can be formed in the frontend or backend of a die. With multiple electrode layers, the memory bit-cell formed using the ferroelectric capacitor results in a taller and narrower bit-cell compared to traditional memory bit-cells. As such, more bit-cells can be packed in a die resulting in a higher density memory that can operate at lower voltages than traditional memories while providing the much sought after non-volatility behavior. In some embodiments, the memory bit-cells are formed in the frontend and backend to further increase the density of the memory per die. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

Figure 1M:
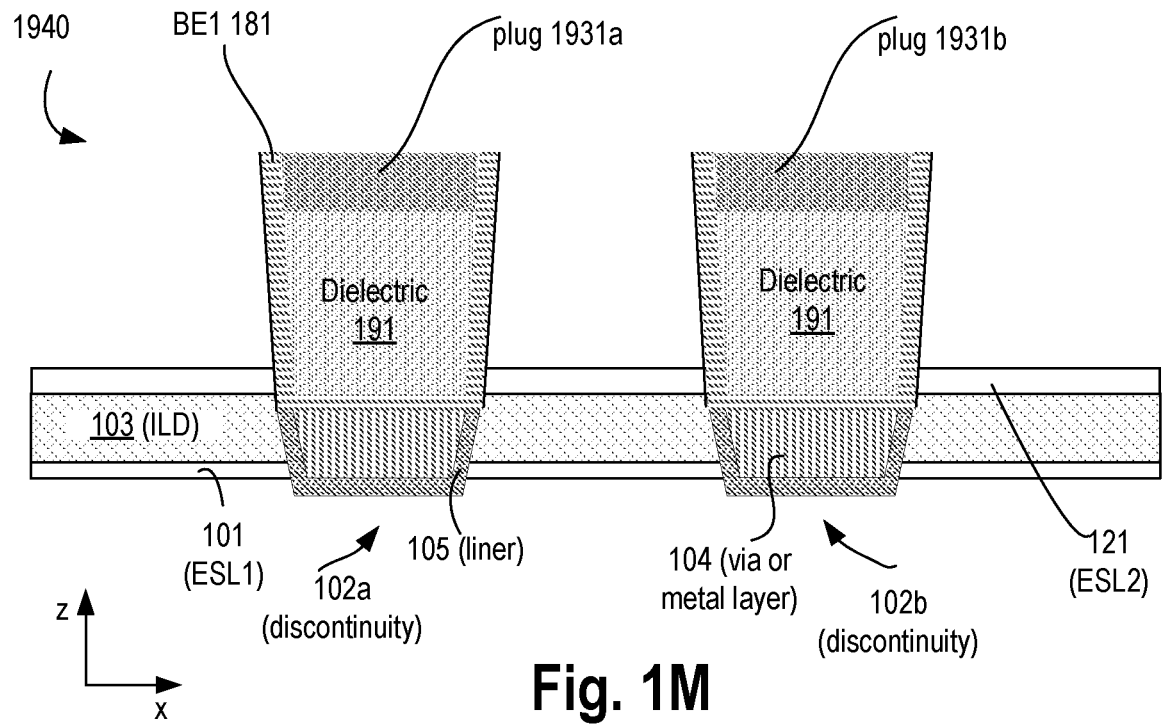
Figure 1N:
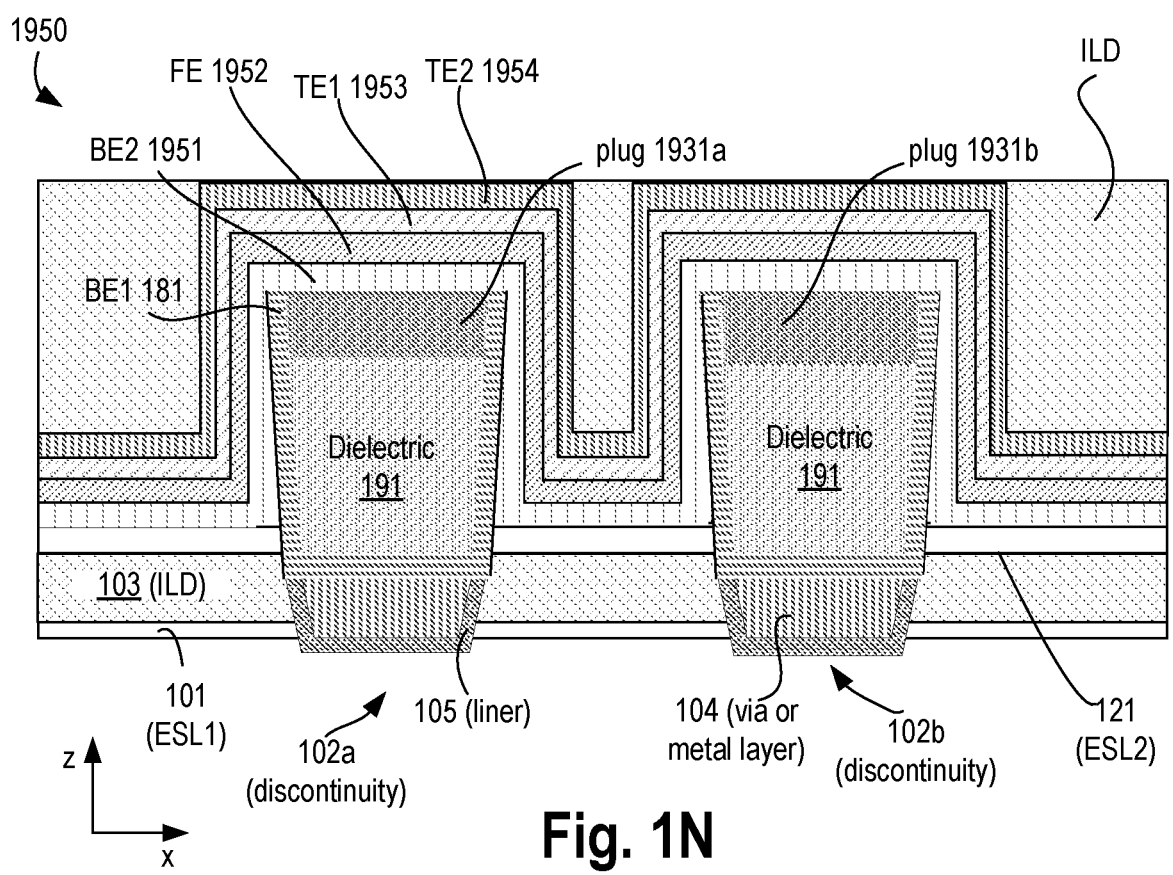
Figure 10:
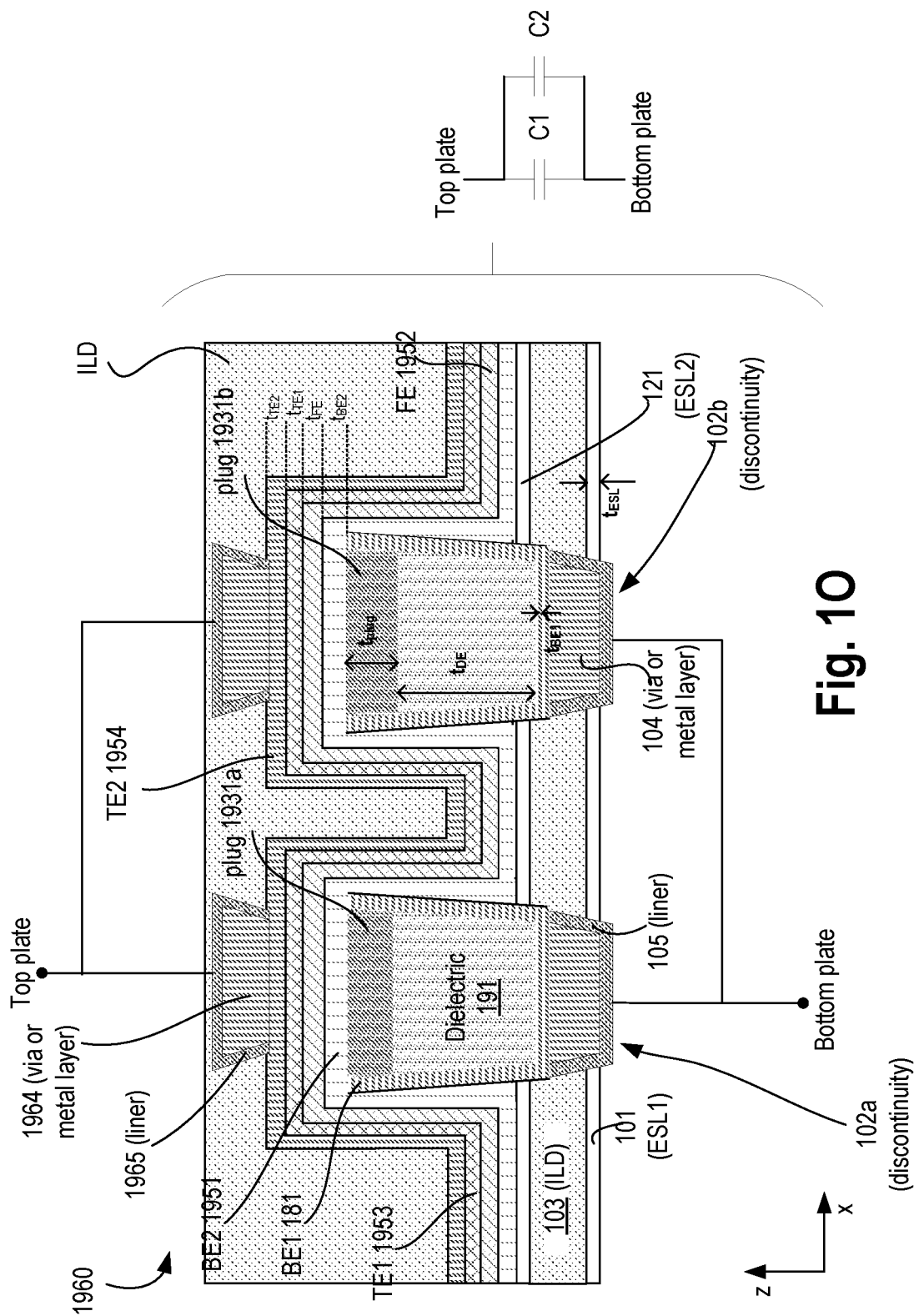
Figure 1P:
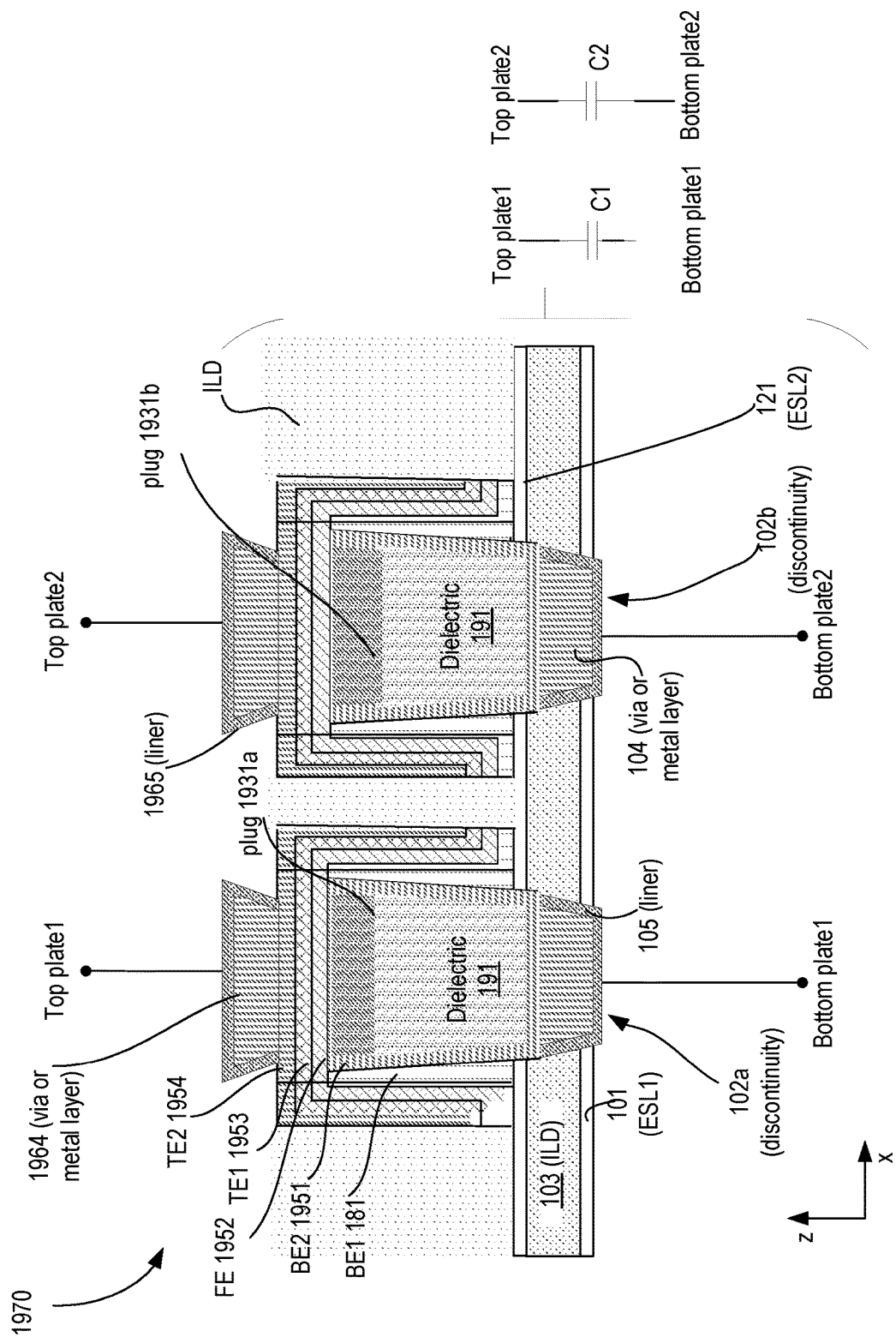

FIGS. 1A-P illustrate cross-sections 100, 120, 130, 140, 150, 160, 170, 180, 190, 1910, 1920, 1930, 1940, 1950, 1960, and 1970, respectively, of processes of patterning or fabricating ferroelectric pillar capacitor, in accordance with some embodiments.

The process described herein assumes certain prior processes already performed. For example, active devices on or in a substrate may already be fabricated and vias and metal interconnect may already be fabricated for integrating to the structure described by the various processes.

Cross-section 100 illustrates a structure comprising a first etch stop layer (ESL) 101 with at least first and second discontinuities 102a and 102b, respectively. The structure further comprises a first interlayer dielectric (ILD) 103 over first ESL, wherein the first ILD has at least first and second discontinuities substantially aligned with the first and second discontinuities of the first ESL. The structure comprises liners 105 on the sidewalls of the first and second discontinuities of the first ILD, wherein the first and second discontinuities of the first ILD include fill metal 104 between liners 105 on the sidewalls. In some embodiments, material for fill metal 104 includes one or more of: Co, W, Cu, Ag, Au, or Ru. In some embodiments, the material for liner 105 includes TaN, TiN, Co, Ru, Ta, metal liner or a combination thereof.

ESL 101 may include any suitable material that has very different etch characteristics than material(s) for liner 105, and fill metal 104. In some embodiments, first ESL 101 comprises a material which includes one or more of: Si, C, or N. In some embodiments, first ESL 101 includes a material which includes one of: SiCN, SiN, SiC, or SiON. In various embodiments, first ILD 103 is a low-k dielectric material. Low-k dielectric has a dielectric constant in a range of 1 to 4. The materials for low-k dielectric material include one or more of: Si, Hf, Zr, or N. Example compounds of first ILD 103 include SiO2, HfSiO4, or ZrSiO4. The top surface of the structure is then polished. For example, chemical mechanical polishing or planarization (CMP) is used to smooth the top surface with a combination of chemical and mechanical forces. The thickness of first ESL 101 along the z-direction is in a range of 1 Angstrom (A) to 50 A. In some embodiments, the thickness of liner 105 along the x-direction is in a range of 1 nanometer (nm) to 50 nm.

Cross-section 120 illustrates deposition of second ESL 121 over the polished top surface of the structure shown in FIG. 1A. The thickness of the second ESL 121 can be the same as that of first ESL 101. In some embodiments, second ESL 121 comprises a material which includes one or more of: Si, C, or N. In various embodiments, second ESL 121 is one of: SiCN, SiN, SiC, or SiON.

Cross-section 130 illustrates forming and positioning a lithographic mask 133 over second ESL 121 to separate the ferroelectric memory capacitor from regulator logic. Here, mask 133 has opening where FE capacitors are later formed.

Cross-section 140 illustrates a fabrication point where ESL 121 is etched to expose region for an FE structure such that first lithographic mask is stripped at openings 141a/b.

Cross-section 150 illustrates the deposition of a sacrificial masking layer 151 over second ESL 121. The sacrificial masking layer 151 also fills into openings 141a/b. Material for sacrificial masking layer 151 can be any suitable material that is etch friendly. In some embodiments, the material for sacrificial masking layer 151 is a dielectric material. The dielectric material has a dielectric constant in a range of 1 to 5. The dielectric material can be any one of: SiO, SiOC, or SiOCN.

Cross-section 160 illustrates forming and positioning a second lithographic mask 161 over sacrificial masking layer 151. Mask 161 can be used for self-aligned quadruple (SAQP) patterning or self-aligned dual patterning (SADP).

Cross-section 170 illustrates a fabricating point after sacrificial masking layer 151 is etched forming openings 171a/b that expose fill metal (e.g., vias) 104.

Cross-section 180 illustrates a fabricating point after first bottom electrode (BE1 181) is conformably deposited over sacrificial masking layer 151, fill metal (e.g., via) 104, and liner 105. BE1 material 181 conforms inside the etched regions (e.g., openings 171a/b). As such, substantially U-shaped structures are formed. The material for BE1 181 includes one or more of: Ti, Ru, Cu, Co, Ta, W, TaN, or WN.

Cross-section 190 illustrates a fabricating point after dielectric 191 is deposited into the U-shaped structures. Dielectric 191 includes one of: SiO, SiOC, or SiOCN. In some embodiments, dielectric 191 includes one or more of: Si, C, or N. The dielectric constant for dielectric 191 is in a range of 1 to 5. In some embodiments, dielectric 191 can be spun on glass and formed by flow-able chemical vapor deposition (f-CVF) or pinched atomic layer deposition (ALD). The thickness of dielectric in the z-direction is in a range of 20 Angstrom (A) to 2000 A.

Cross-section 1910 illustrates a fabricating point after dielectric 191 and bottom electrode 181 on top of sacrificial masking layer 151 are polished. Chemical mechanical polishing or planarization (CMP) is used to smooth the top surface of dielectric 191 and BE1 181. with a combination of chemical and mechanical forces.

Cross-section 1920 illustrates a fabricating point after dielectric 191 is recessed forming recessed regions 1921a and 1921b. The recessed regions 1921a and 1921b are used for forming plugs. The plugs are dielectric material, which are different, and separate from dielectric material 191. While plugs are described to be dielectric material, in some embodiments, they can comprise metal. For example, plugs can have the same material as those for BE1, BE2, TE1, or TE2.

The dielectric constant for dielectric 1931a/b is in a range of 1 to 5. Cross-section 1930 illustrates a fabricating point after dielectric 1931a/b are deposited to form plugs. In some embodiments, dielectric 1931a/b include one or more of: Si, Al, or Zr. In some embodiments, dielectric 1931a/b includes one of: SiN, Al2O3, or ZrO. The thickness ($t_{plug}$) of the plugs in the z-direction is in a range of 20 Angstroms (A) to 500 A.

Cross-section 1940 illustrates the process after sacrificial masking layer 151 is selectively removed (or etched). The etch process is selective to plugs 1931a/b, BE1 181 and second ESL 121.

Cross-section 1950 illustrates a fabrication point with a stack of layers for forming a pillar FE capacitor. The stack of layers include bottom electrode material 1951 (BE2) adjacent to second ESL 121 and BE1 181; FE material 1952 adjacent to BE2 1951; first top electrode material (TE1) 1953; and second top electrode material (TE2) 1954. TE2 1954 is adjacent to TE1 1953. TE1 1953 is adjacent to FE material 1952. While two layers of TE and BE are shown, any number of layers may be used.

In some embodiments, the stack of layers are deposited using the techniques of physical vapor deposition (PVD), chemical vapor deposition (CVD), and/or atomic layer deposition (ALD). The deposition of these layers can be integrated or de-integrated. For example, BE1 181, BE2 1951, FE 1952, TE1 1953, and TE2 1954 are deposited in the following sequence; BE1 181 and BE2 1951 are deposited and then after an air break, FE 1952 is deposited over BE2 1951. TE1 1953 is then deposited over FE 1952 after an air break. In some embodiments, BE1 181, BE2 1951, FE 1952, TE1 1953, and TE2 1954 are deposited in the following sequence; BE1 181 and BE2 1951 are deposited and then without any air break, FE 1952 is deposited over BE2 1951. TE1 1953 is then deposited over FE 1952 without an air break. In some embodiments, to improve various film properties, the process of annealing is integrated with deposition of BE1 181, BE2 1951, FE 1952, TE1 1953, and TE2 1954. For example, BE1 181, BE2 1951, FE 1952, TE1 1953, and TE2 1954 are deposited in the following sequence; BE1 181 and BE2 1951 are deposited and annealed and then without any air break, FE 1952 is deposited over BE2 1951 and annealed. TE1 1953 is then deposited over FE 1952 without an air break and annealed.

Film properties include one or more of: adhesion, hermeticity, structure, resistance, ferroelectricity, reliability, etc. In this process BE1 181 and BE2 1951 are deposited followed by annealing. Annealing is controlled at a ramp rate within a particular temperature range in the presence of certain materials. For example, annealing is performed at a controlled rate of 0.1C/min (Celsius per minute), temperature range of 300 C to 900 C, and ambient N2, O2, NH3, N2O, Ar, or a combination thereof, for a time duration ranging from 1 ns to 30 minutes. Any suitable heat source can be used for annealing. For example, laser, lamp, or furnace can be used as the heat source.

While two layers for bottom electrode (BE) are shown (e.g., BE1 181 and BE2 1951), any number of N layers can be used for forming the bottom electrode (BE), where N ranges from 1 to any suitable number. Similarly, while two layers for top electrode (TE) are shown (e.g., TE1 1953 and TE2 1954), any number of M layers can be used for the top electrode (TE), where M is in a range of 1 to any suitable number. In some embodiments, N is equal to M. In some embodiments, N is different from M. The thickness of each layer in the stack is in a range of 0.1 nm (nanometer) to 50 nm. For example, thickness $t_{BE1}$ of BE1 181, thickness $t_{BE2}$ of BE2 1951, thickness $t_{FE}$ of FE 1952, thickness $t_{TE1}$ of TE1 1953, thickness $t_{TE2}$ of TE2 1954 along the z-axis is in a range of 0.1 nm to 50 nm.

In some embodiments, BE1 181, BE2 1951, TE1 1953, and TE2 1954 comprise a conductive material, which includes one or more of: Ti, TiN, Ru, RuO2, IrO2, TaN, SrO, Ta, Cu, Co, W, or WN. In some embodiments, the electrodes directly adjacent to FE 1952 comprise conductive oxides. In some embodiments, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. The materials for the electrodes may be the same or different. For example, material for TE1 1953 is different from the material of TE2 1954, and material for BE1 181 is different from the material for BE2 1951, while materials BE1 181 and TE2 1954 may be the same, and materials BE2 1951 and TE1 1953 may be the same.

Threshold in the FE material has a highly non-linear transfer function in the polarization vs. voltage response. The threshold is related to a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished by the use of lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In various embodiments, FE material 1952 can be any suitable low voltage FE material that allows the FE material to switch its state by a low voltage (e.g., 100 mV). In some embodiments, FE material 1952 comprises a perovskite of the type ABO$_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rate earth substitution into the Bi site can tune the spontaneous distortion. In some embodiments, FE material is contacted with a conductive metal oxide that includes one of the conducting perovskite conductive oxides exemplified by: La—Sr—CoO3, SrRuO3, La—Sr—MnO3, YBa2Cu3O7, Bi2Sr2CaCu2O8, and LaNiO3.

In some embodiments, FE material 1952 comprises a stack of layers including low voltage FE material between (or sandwiched between) conductive oxides. In various embodiments, when FE material 1952 is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, FE material 1952 comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when FE material 1952 comprises hexagonal ferroelectrics, the conductive oxides are of A2O3 (e.g., In2O3, Fe2O3) and ABO3 type, where 'A' is a rare earth element and B is Mn.

In some embodiments, FE material 1952 comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material 1952 for storing the charge state, the embodiments are also applicable for paraelectric material. For example, the capacitor of various embodiments can be formed using paraelectric material instead of ferroelectric material.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf1-Si—O, La-substituted PbTiO3, PMN-PT based relaxor ferroelectrics.

In some embodiments, FE material 1952 includes one of more of: Hafnium (Hf), Zirconium (Zr), Aluminum (Al), Silicon (Si), their oxides or their alloyed oxides. In some embodiments, FE material 1952 includes one or more of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, FE material 1952 includes one or more of Bismuth ferrite (BFO), lead zirconate titanate (PZT), BFO with doping material, or PZT with doping material, wherein the doping material is one of Nb or La, and relaxor ferroelectrics such as PMN-PT.

In some embodiments, FE material 1952 includes Bismuth ferrite (BFO), BFO with a doping material wherein the doping material is one of Lanthanum, or any element from the lanthanide series of the periodic table. In some embodiments, FE material 1952 includes lead zirconium titanate (PZT), or PZT with a doping material, wherein the doping material is one of La, Nb. In some embodiments, FE material 1952 includes a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, FE material 1952 includes Hafnium oxides of the form, Hf1-x Ex Oy where E can be Al, Ca, Ce, Dy, er, Gd, Ge, La, Sc, Si, Sr, Sn, or Y. In some embodiments, FE material 1952 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, FE material 1952 includes Hafnium oxides of the form, Hf1-x Ex Oy where E can be Al, Ca, Ce, Dy, er, Gd, Ge, La, Sc, Si, Sr, Sn, or Y. In some embodiments, FE material 1952 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, FE material 1952 comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, BE2 1951 and TE1 1953 are conductive oxides. In some embodiments, when metallic perovskite is used for FE material 1952, conductive oxides (e.g., binary conductive oxides) can include one or more of: IrO$_2$, RuO$_2$, PdO$_2$, OSO$_2$, or ReO$_3$. In some embodiments, conductive oxides includes one or more of: Ir, Ru, Pd, Os, or Re. In some embodiments, the perovskite is doped with La or Lanthanides. For example, conductive oxides (e.g., metallic perovskites) include one or more of: LaCoO3, SrCoO3, SrRuO3, LaMnO3, SrMnO3, YBa2Cu3O7, Bi2, Sr2CaCu2O8, or LaNiO3. In some embodiments, conductive oxides includes one or more of: La, Co, Sr, Ru, Mn, Y, Ba, Cu, Bi, Ca, or Ni.

In some embodiments, BE2 1951 and TE1 1953 are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when ferroelectric 1952 comprises hexagonal ferroelectric material, BE2 1951 and TE1 1953 can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as conductive oxides for BE2 1951 and TE1 1953.

In some embodiments, a conductive material (not shown) is conformably deposited over TE2 1954. The conductive material may include any one of: Cu, Ag, Au, W, Co, Ta, Ti, TaN, or a combination of them. This conductive material forms the top plate of the pillar capacitor.

Cross-section 1960 illustrates a particular embodiment where the two pillar capacitors are coupled in parallel. For sake of simplicity, various known processing steps are not shown that result in forming metal vias 1964 and liner 1965. These vias are coupled and form the top plate of pillar capacitors. Fill metal (e.g., vias) 104 are coupled to form the bottom plate of the pillar capacitors.

Cross-section 1970 illustrates a fabricating point where two pillar capacitors are formed. Here, layers of BE2 1951, FE 1952, TE1 1953, and TE2 1954 are selectively etched to form two capacitors. Here, the capacitors are isolated by ILD to prevent cross-coupling of the capacitors C1 and C2.

While the aspect ratio of the pillar capacitor is shown as 1:2 relative to the height in the z-direction for the fill metal (e.g., via) 104, where pillar capacitor is 2 times taller than the height of the via, the aspect ratio is generally about 1:10. In some embodiments, depending on the choice of materials for the various layers of the pillar capacitor, the aspect ratio for the pillar capacitor relative to fill metal (e.g., via) 104 can range from 1:5 to 1:30.

Figure 2B:
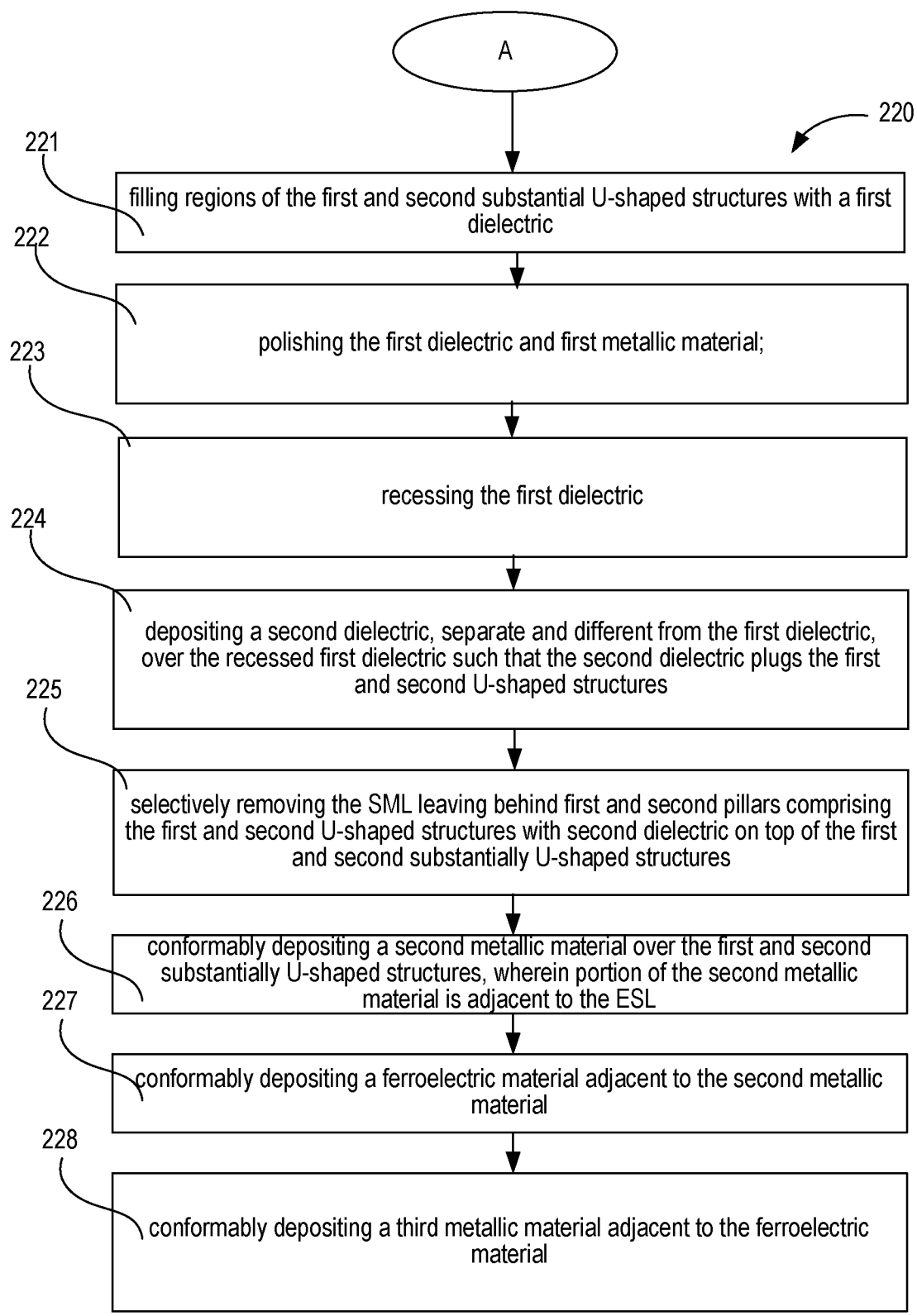

FIG. 2A-B illustrate flowcharts 200 and 220, respectively, of a method of patterning or fabricating ferroelectric pillar capacitor, in accordance with some embodiments.

At block 201, a first etch stop layer (ESL) 101 is formed with at least first and second discontinuities 102*a* and 102*b*, respectively. ESL 101 includes one or more of: Si, C, or N. First ESL 101 has a thickness in a range of 1 nm to 50 nm along the z-direction.

At block 202 a first interlayer dielectric (ILD) 103 is deposited over first ESL 101, wherein first ILD 103 has at least first and second discontinuities substantially aligned with the first and second discontinuities of the first ESL.

At block 203, liners 105 are formed on sidewalls of the first and second discontinuities of first ILD 103, wherein the first and second discontinuities of first ILD 103 include fill metal 104 between liners 105 on the sidewalls.

At block 204, fill metal 104 of first discontinuity 102a of first ILD 103 is coupled with a source region of a first transistor. Likewise, fill metal 104 of second discontinuity 102b of first ILD 103 is coupled with a source region of a second transistor. The first and second transistors is one of a CMOS, TFET, gate all around transistor, planar transistor, or non-planar transistor. In this case, the two capacitors being formed are coupled to two separate transistors to produce two memory bit-cells.

At block 205, a second ESL 121 is deposited over first ILD 103, wherein the second ESL 121 includes a first discontinuity and a second discontinuity, wherein the first discontinuity of the ESL 121 is substantially aligned with the first discontinuity 102a of first ESL 101 and first ILD 103.

At block 206, a sacrificial masking layer (SML) 151 is deposited over second ESL 121. At block 207, SML 151 is lithographically patterned (via mask 161) with reference to the first and second discontinuities of second ESL 121.

At block 208, SML 151 is etched up to second ESL 121. Thereafter, a first conductive material BE-1 181 is conformably deposited on the etched SML 151 to form first and second substantially U-shaped structures, wherein the first and second substantial U-shaped structures are substantially aligned over the first and second discontinuities of first ILD 103. The process then proceeds to the block of FIG. 2B via marker A.

At block 221, regions of the first and second substantially U-shaped structures are filled with a first dielectric 191. First dielectric 191 includes one of: SiO, SiOC, or SiOCN. The thickness of first dielectric 191 along z-direction is in a range of 20 A to 2000 A.

At block 222, first dielectric 191 and first conductive material BE1 181 are polished. For example, a CMP process is used to polish the surfaces of first dielectric 191 and first conductive material BE1 181. At block 223, first dielectric 191 is recessed such that recessed regions 1921a/b are formed.

At block 224, a first structure 1931a/b, separate and different from the first dielectric, is deposited over the recessed first dielectric such that the first structure plugs the first and second U-shaped structures. First structure 1931a/b includes one of: SiN, Al2O3, or ZrO.

At block 225, SML 151 is selectively removed leaving behind first and second pillars (as shown in FIG. 1M) comprising the first and second U-shaped structures with first structure on top of the first and second substantially U-shaped structures.

At block 226, a second conductive material BE2 1951 is conformably deposited over the first and second substantially U-shaped structures, wherein portion of the second conductive material 1951 is adjacent to the second ESL 121. The second conductive material BE2 1951 includes one or more of: SrO, IrO2, RuO2, PdO2, PsO2, ReO3, LaCoO3, SrCoO3, SrRuO3, LaMnO3, SrMnO3, YBa2Cu3O7, Bi2Sr2CaCu2O8, or LaNiO3.

At block 227, a ferroelectric (FE) material 1952 is conformably deposited adjacent to the second conductive material. The FE material includes one of: perovskite, hexagonal ferroelectric, hexagonal ferroelectrics of a type h-RMnO3, or improper ferroelectric. Perovskites includes one of: LaCoO3, SrCoO3, SrRuO3, LaMnO3, SrMnO3, YBa2Cu3O7, Bi2Sr2CaCu2O8, or LaNiO3. Hexagonal ferroelectric includes one of: YMnO3, or LuFeO3. R in hexagonal ferroelectrics is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y). Improper ferroelectric includes one of: [PTO/STO]n or [LAO/STO]n, where 'n' is between 1 to 100.

At block 228, a third conductive material TE1 1953 is conformably deposited adjacent to ferroelectric material 1952. A fourth conductive material TE2 1954 is conformably deposited over third conductive material TE1 1953. The first conductive material BE1 181 and the fourth material 1954 includes one or more of: Ti, Ru, Cu, Co, Ta, W, TaN, or WN. The first, second, third, and fourth conductive materials have a thickness in a range of 1 nm to 50 nm.

FIG. 3 illustrates a 1T-1C memory bit-cell 300 comprising the ferroelectric pillar capacitor of various embodiments. 1T-1C memory bit-cell 300 is one practical use of FE capacitor 320 formed using the various processes described with reference to FIGS. 1A-P and FIGS. 2A-B. Here, one-transistor, one-capacitor (1T-1C) device is illustrated. In some embodiments, an n-type transistor MN is formed and is coupled to FE capacitor 320.

Transistor MN can be a planar or non-planar transistor. In some embodiments, transistor MN can be formed in the frontend or backend. In some embodiments, FE capacitor 320 is formed in the frontend or backend. While transistor MN is illustrated as an n-type transistor, it can be replaced with a p-type transistor. The transistor here can be Square Wire, Rectangular Ribbon Transistor, Gate All Around Cylindrical Transistor, Tunneling FET (TFET), ferroelectric FET (FeFETs), bi-polar (BJT), BiCMOS, or other devices implementing transistor functionality, for instance, carbon nanotubes or spintronic devices. In some embodiments, the transistor is a typical metal oxide semiconductor (MOS) transistor or its derivative including Tri-Gate and FinFET transistors. While MOSFET have symmetrical source and drain terminals, TFET device has asymmetric source and drain terminals.

Transistor MN is formed in/on substrate 301, and comprises source region 302, drain region 303, channel region 304, source contact 308a, drain contact 308b, and a gate comprising gate dielectric 305, gate liners 306a and 306b; gate metal 307.

Substrate 301 includes a suitable semiconductor material such as: single crystal silicon, polycrystalline silicon and silicon on insulator (SOI). In one embodiment, substrate 301 includes other semiconductor materials such as: Si, Ge, SiGe, or a suitable group III-V or group III-N compound. The substrate 301 may also include semiconductor materials, metals, dopants, and other materials commonly found in semiconductor substrates.

In some embodiments, source region 302 and drain region 303 are formed within substrate 301 adjacent to the gate stack of the transistor. The source region 302 and drain region 303 are generally formed using either an etching/deposition process or an implantation/diffusion process.

In the etching/deposition process, substrate 301 may first be etched to form recesses at the locations of source region 302 and drain region 303. An epitaxial deposition process may then be carried out to fill the recesses with material that is used to fabricate the source region 302 and drain region 303. In the implantation/diffusion process, dopants such as boron, aluminum, antimony, phosphorous, or arsenic may be ion-implanted into the substrate to form source region 302 and drain region 303. An annealing process that activates the dopants and causes them to diffuse further into substrate 301 typically follows the ion-implantation process.

In some embodiments, one or more layers of metal and/or metal alloys are used to form the source region 302 and drain region 303. In some embodiments, source region 302 and drain region 303 are formed using one or more alternate semiconductor materials such as germanium or a suitable group III-V compound. In some embodiments, source region 302 and drain region 303 are fabricated using a silicon alloy such as silicon germanium or silicon carbide. In some embodiments, the epitaxially deposited silicon alloy is doped in-situ with dopants such as boron, arsenic, or phosphorous.

The semiconductor material for channel region 304 may have the same material as substrate 301, in accordance with some embodiments. In some embodiments, channel region 304 includes one of: Si, SiGe, Ge, and GaAs.

The gate dielectric layer 305 may include one layer or a stack of layers. The one or more layers may include high-k dielectric material, silicon oxide, and/or silicon dioxide (SiO$_2$). The high-k dielectric material may include elements such as: zinc, niobium, scandium, lean yttrium, hafnium, silicon, strontium, oxygen, barium, titanium, zirconium, tantalum, aluminum, and lanthanum. Examples of high-k materials that may be used in the gate dielectric layer include: lead zinc niobate, hafnium oxide, lead scandium tantalum oxide, hafnium silicon oxide, yttrium oxide, aluminum oxide, lanthanum oxide, barium strontium titanium oxide, lanthanum aluminum oxide, titanium oxide, zirconium oxide, tantalum oxide, and zirconium silicon oxide. In some embodiments, when a high-k material is used, an annealing process is used on the gate dielectric layer 305 to improve its quality.

In some embodiments, a pair of liner layers (sidewall liners) 306a/b are formed on opposing sides of the gate stack that bracket the gate stack. The pair of liner layers 306a/b are formed from a material such as: silicon oxynitride, silicon nitride, silicon nitride doped with carbon, or silicon carbide. Processes for forming sidewall liners are well-known in the art and generally include deposition and etching process operations. In some embodiments, a plurality of liner pairs may be used. For example, two pairs, three pairs, or four pairs of sidewall liners may be formed on opposing sides of the gate stack.

Gate metal 307 may comprise at least one P-type work-function metal or N-type work-function metal, depending on whether the transistor is to be a p-type or an n-type transistor. Gate metal 307 may comprise a stack of two or more metal layers, where one or more metal layers are work-function metal layers and at least one metal layer is a conductive fill layer.

For an n-type transistor, metals that may be used for the gate metal 307 include: aluminum carbide, tantalum carbide, zirconium carbide, and hafnium carbide. In some embodiments, metal for gate metal 307 for n-type transistor include: aluminum, hafnium, zirconium, titanium, tantalum, and their alloys. An n-type metal layer will enable the formation of an n-type gate metal 307 with a work function that is between about 3.9 eV and about 4.2 eV. In some embodiments, gate metal 307 includes one of: TiN, TiSiN, TaN, Cu, Al, Au, W, TiSiN, or Co. In some embodiments, metal 307 includes one or more of: Ti, N, Si, Ta, Cu, Al, Au, W, or Co.

For a p-type transistor, metals that are used for gate metal 307 include, but are not limited to, ruthenium, palladium, platinum, cobalt, nickel, and conductive metal oxides. An example of conductive oxide includes ruthenium oxide. A p-type metal layer will enable the formation of a p-type gate metal 307 with a work function that is between about 4.9 eV and about 5.2 eV.

The source contact 308b is coupled to via 309b, which is coupled to fill metal 104. Fill metal 104 is connected to the bit-line (BL) via metal contact 104 etched through ESL 101. The drain contact 308a is coupled to ferroelectric structure 1952 through via 309a and fill metal 104. Any suitable material can be used for drain and source contacts 308a/b and via 309a/b. For example, one or more of Ti, N, Si, Ta, Cu, Al, Au, W, or Co can be used for drain and source contacts 308a/b and via 309a/b. Gate metal 307 may be connected to word-line (WL) directly or through vias and metal layers 316 and 317, respectively. A plate-line (PL) is coupled to the FE structure 1952 through metal contact 1964 etched through another ESL3 1952.

Figure 4:
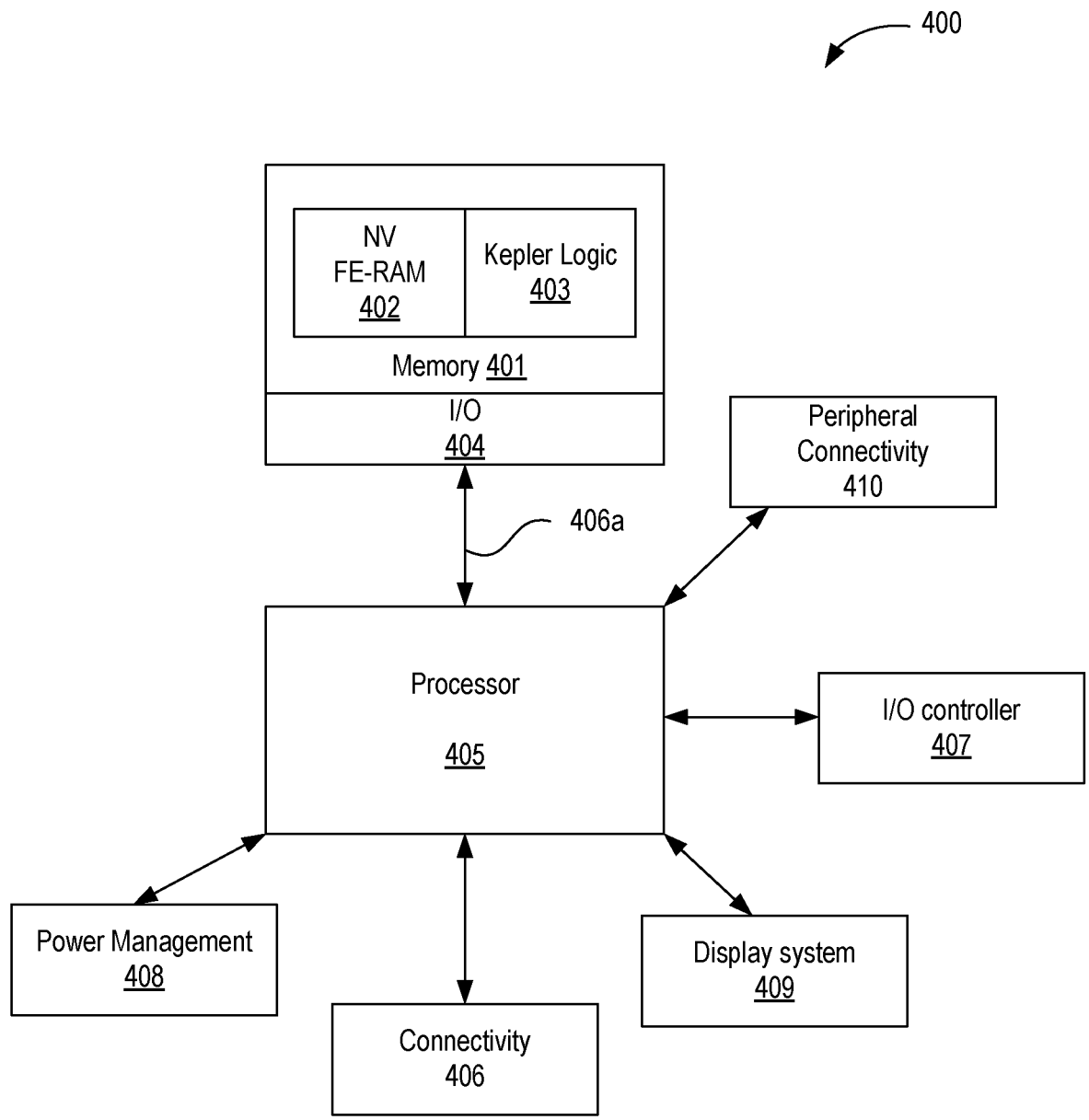
FIG. 4 illustrates a system-on-chip (SOC) including memory having an array of 1T-1C bit-cells and logic, in accordance with some embodiments.

FIG. 4 illustrates a system-on-chip (SOC 400 including a memory chip having an array of 1T-1C bit-cells and logic, in accordance with some embodiments. SOC 400 comprises memory module 401 having non-volatile (NV) ferroelectric random access memory (FE-RAM) array 402. Memory module 401 further comprises CMOS logic 403 such as decoders, multiplexers, and drivers to drive BL (bit-line), WL (word-line), PL (plate-line). Memory module 401 further includes an input-output (IO) interface 404 which is used to communicate with another device such as processor 405 via interconnect 406a.

SOC further comprises a memory I/O (input-output) interface 404. The interface may be double-data rate (DDR) compliant interface or any other suitable interface to communicate with a processor. Processor 405 of SOC 400 can be a single core or multiple core processor. Processor 405 can be a general-purpose processor, a digital signal processor (DSP), or an application specific integrated circuit (ASIC) processor. In some embodiments, processor 405 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, AI processor 405 has reduced latency of computing the training model and using the training model, which reduces the power consumption of such AI processor systems.

Processor 405 may be coupled to a number of other chip-lets that can be on the same die as SOC 400 or on separate dies. These chip-lets include connectivity circuitry 406, I/O controller 407, power management 408, and display system 409, and peripheral connectivity 410.

Connectivity circuitry 406 represents hardware devices and software components for communicating with other devices. Connectivity circuitry 406 may support various connectivity circuitries and standards. For example, connectivity circuitry 406 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity circuitry 406 may support non-cellular standards such as WiFi.

I/O controller 407 represents hardware devices and software components related to interaction with a user. I/O controller 407 is operable to manage hardware that is part of an audio subsystem and/or display subsystem. For example, input through a microphone or other audio device can provide input or commands for one or more applications or functions of SOC 400. In some embodiments, I/O controller 407 illustrates a connection point for additional devices that connect to SOC 400 through which a user might interact with the system. For example, devices that can be attached to the SOC 400 might include microphone devices, speaker or stereo systems, video systems or other display devices, keyboard or keypad devices, or other I/O devices for use with specific applications such as card readers or other devices.

Power management 408 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 408 may accordingly put such logic into low power state without the worry of losing data. Power management may select a power state according to Advanced Configuration and Power Interface (ACPI) specification for one or all components of SOC 400.

Display system 409 represents hardware (e.g., display devices) and software (e.g., drivers) components that provide a visual and/or tactile display for a user to interact with the processor 405. In some embodiments, display system 409 includes a touch screen (or touch pad) device that provides both output and input to a user. Display system 409 may include a display interface, which includes the particular screen or hardware device used to provide a display to a user. In some embodiments, the display interface includes logic separate from processor 405 to perform at least some processing related to the display.

Peripheral connectivity 410 may represent hardware devices and/or software devices for connecting to peripheral devices such as printers, chargers, cameras, etc. Peripheral connectivity 410 say support communication protocols, e.g., PCIe (Peripheral Component Interconnect Express), USB (Universal Serial Bus), Thunderbolt, High Definition Multimedia Interface (HDMI), Firewire, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

Following examples are provided that illustrate the various embodiments. The examples can be combined with other examples. As such, various embodiments can be combined with other embodiments without changing the scope of the invention.

Example 1: An apparatus comprising: a transistor; an etch stop layer (ESL); and a pillar capacitor coupled to the transistor, wherein the pillar capacitor comprises: a first electrode comprising first conductive material, wherein the first electrode is substantially a U-shaped structure; a first dielectric inside the U-shaped structure of the first electrode; a first structure, separate and different from the first dielectric, wherein the first structure is adjacent to the first dielectric such that the first structure plugs the U-shaped structure; a second electrode comprising second conductive material, the second electrode adjacent to the first electrode, wherein a portion of the second electrode is adjacent to the ESL; a ferroelectric material adjacent to the second electrode; a third electrode adjacent to the ferroelectric material, the third electrode comprising third conductive material; and a fourth electrode adjacent to the third electrode, the fourth electrode comprising fourth conductive material.

Example 2: The apparatus of example 1, wherein the ESL includes one or more of: Si, C, or N.

Example 3: The apparatus of example 1, wherein the first conductive material and the fourth material includes one or more of: Ti, Ru, Cu, Co, Ta, W, TaN, or WN.

Example 4: The apparatus of example 1, wherein the second and third conductive materials include one or more of: SrO, IrO2, RuO2, PdO2, PsO2, ReO3, LaCoO3, SrCoO3, SrRuO3, LaMnO3, SrMnO3, YBa2Cu3O7, Bi2Sr2CaCu2O8, LaNiO3, or their alloys.

Example 5: The apparatus of example 1, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST); perovskite includes one of: BaTiO3, PbTiO3, KNbO3, NaTaO3, LaCoO3, SrCoO3, SrRuO3, LaMnO3, SrMnO3, YBa2Cu3O7, Bi2Sr2CaCu2O8, or LaNiO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hf1-x Ex Oy where E can be Al, Ca, Ce, Dy, er, Gd, Ge, La, Sc, Si, Sr, Sn, Y; Al(1-x)Sc(x)N, Ga(1-x)Sc(x)N, Al(1-x)Y(x)N or Al(1-x-y)Mg(x)Nb(y)N, y doped Hf2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, Potassium strontium niobate; or improper ferroelectric includes one of: [PTO/STO]n or [LAO/STO]n, where 'n' is between 1 to 100.

Example 6: The apparatus of example 1, wherein the first dielectric comprises one of: SiO, SiOC, or SiOCN.

Example 7: The apparatus of example 1, wherein the first structure comprises one of: SiN, Al2O3, or ZrO.

Example 8: The apparatus of example 1, wherein the first, second, third, and fourth electrodes have a thickness in a range of 0.1 nm to 50 nm; and wherein the ESL has a thickness in a range of 0.1 nm to 50 nm.

Example 9: The apparatus of example 1, wherein the transistors is one of a CMOS, TFET, all gate around transistor planar transistor, or non-planar transistor.

Example 10: A method comprising: forming a first transistor having source and drain regions; forming a second transistor having source and drain regions; coupling the drain regions of the first and second transistors to a bit-line; forming over a first etch stop layer (ESL) with at least first and second discontinuities; depositing a first interlayer dielectric (ILD) over the first ESL, wherein the first ILD has at least first and second discontinuities substantially aligned with the first and second discontinuities of the first ESL; depositing liners on sidewalls of the first and second discontinuities of the first ILD, wherein the first and second discontinuities of the first ILD include fill metal between the liners on the sidewalls; coupling the fill metal of the first discontinuity of the first ILD with the source region of the first transistor; coupling the fill metal of the second discontinuity of the first ILD with the source region of the second transistor; depositing a second ESL over the first ILD, wherein the second ESL includes a first discontinuity and a second discontinuity, wherein the first discontinuity of the second ESL is substantially aligned with the first discontinuities of the first ESL and first ILD; depositing a sacrificial masking layer (SML) over the second ESL; lithographically patterning the SML with reference to the first and second discontinuities of the second ESL; etching the SML up to the second ESL; conformably depositing a first conductive material on the etched SML to form first and second substantial U-shaped structures, wherein the first and second substantial U-shaped structures are substantially aligned over the first and second discontinuities of the first ILD; filling regions of the first and second substantial U-shaped structures with a first dielectric; polishing the first dielectric and first conductive material; recessing the first dielectric; depositing a first structure, separate and different from the first dielectric, over the recessed first dielectric such that the first structure plugs the first and second U-shaped structures; selectively removing the SML leaving behind first and second pillars comprising the first and second U-shaped structures, respectively, with first structure on top of the first and second substantially U-shaped structures; conformably depositing a second conductive material over the first and second substantially U-shaped structures, wherein portion of the second conductive material is adjacent to the ESL; conformably depositing a ferroelectric material adjacent to the second conductive material; conformably depositing a third conductive material adjacent to the ferroelectric material; conformably depositing a fourth conductive material adjacent to the third conductive material.

Example 11: The method of example 10, wherein the ESL includes one or more of: Si, C, or N.

Example 12: The method of example 10, wherein the first conductive material and the fourth material includes one or more of: Ti, Ru, Cu, Co, Ta, W, TaN, or WN.

Example 13: The method of example 10, wherein the second and third conductive materials include one or more of: SrO, IrO2, RuO2, PdO2, PsO2, ReO3, LaCoO3, SrCoO3, SrRuO3, LaMnO3, SrMnO3, YBa2Cu3O7, Bi2Sr2CaCu2O8, LaNiO3, or their alloys.

Example 14: The method of example 10, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hf1-x Ex Oy where E can be Al, Ca, Ce, Dy, er, Gd, Ge, La, Sc, Si, Sr, Sn, or Y; Al(1-x)Sc(x)N, Ga(1-x)Sc(x)N, Al(1-x)Y(x)N or Al(1-x-y)Mg(x)Nb(y)N, y doped Hf2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 15: The method of example 10, wherein the first dielectric includes one of: SiO, SiOC, or SiOCN.

Example 16: The method of example 10, wherein the first structure includes one of: SiN, Al2O3, or ZrO.

Example 17: The method of example 10, wherein the first, second, third, and fourth conductive materials have a thickness in a range of 0.1 nm to 50 nm; and wherein the first ESL has a thickness in a range of 0.1 nm to 50 nm.

Example 18: The method of example 10, wherein the first and second transistors is one of a CMOS, TFET, gate all around transistor, planar transistor, or non-planar transistor.

Example 19: A system comprising: a processor; a communication interface communicatively coupled to the processor; and a memory coupled to the processor, wherein the memory includes bit-cells, wherein one of the bit-cell includes: a transistor; an etch stop layer (ESL); and a pillar capacitor coupled the transistor, wherein the pillar capacitor comprises: a first electrode comprising first conductive material, wherein the first electrode is substantially a U-shaped structure; a first dielectric inside the U-shaped structure of the first electrode; a first structure, separate and different from the first dielectric, wherein the first structure is adjacent to the first dielectric such that the first structure plugs the U-shaped structure; a second electrode comprising second conductive material, the second electrode conformably adjacent to the first electrode, wherein a portion of the second electrode is adjacent to the ESL; a ferroelectric material adjacent to the second electrode; a third electrode adjacent to the ferroelectric material, wherein the third electrode includes third conductive material; and a fourth electrode adjacent to the third electrode, wherein the fourth electrode includes fourth conductive material.

Example 20: The system of example 19, wherein the processor is one of an accelerator or an artificial intelligence (AI) processor.

Example 21: The system of example 19, wherein: the ESL includes one or more of: Si, C, or N; the first conductive material and the fourth material includes one or more of: Ti, Ru, Cu, Co, Ta, W, TaN, or WN; the second conductive material includes one of: SrO, IrO2, RuO2, PdO2, PsO2, ReO3, LaCoO3, SrCoO3, SrRuO3, LaMnO3, SrMnO3, YBa2Cu3O7, Bi2Sr2CaCu2O8, or LaNiO3; the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of the form, Hf1-x Ex Oy where E can be Al, Ca, Ce, Dy, er, Gd, Ge, La, Sc, Si, Sr, Sn, Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, Potassium strontium niobate; or improper ferroelectric includes one of: [PTO/STO]n or [LAO/STO]n, where 'n' is between 1 to 100; the first dielectric comprises one of: SiO, SiOC, or SiOCN; and the first structure comprises: SiN, Al2O3, or ZrO.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a transistor;
   an etch stop layer (ESL); and
   a pillar capacitor coupled to the transistor, wherein the pillar capacitor comprises:
   a first electrode comprising a first conductive material, wherein the first electrode is substantially a U-shaped structure, wherein the U-shaped structure comprises a base portion and substantially vertical portions in contact with the base portion;
   a first dielectric inside the U-shaped structure of the first electrode;
   a first structure, separate and different from the first dielectric, wherein the first structure is adjacent to the first dielectric such that the first structure plugs the U-shaped structure, and wherein the first structure is laterally adjacent to first portions of the substantially vertical portions of the first electrode;
   a second electrode comprising a second conductive material, the second electrode adjacent to second portions of the substantially vertical portions of the first electrode, wherein a portion of the second electrode is adjacent to the ESL;
   a ferroelectric material adjacent to the second electrode;
   a third electrode adjacent to the ferroelectric material, the third electrode comprising a third conductive material; and
   a fourth electrode adjacent to the third electrode, the fourth electrode comprising a fourth conductive material.

2. The apparatus of claim 1, wherein the ESL includes one or more of: Si, C, or N.

3. The apparatus of claim 1, wherein the first conductive material and the fourth conductive material includes one or more of: Ti, Ru, Cu, Co, Ta, W, TaN, or WN.

4. The apparatus of claim 1, wherein the second and third conductive materials include one or more of: SrO, IrO2, RuO2, PdO2, PsO2, ReO3, LaCoO3, SrCoO3, SrRuO3, LaMnO3, SrMnO3, YBa2Cu3O7, Bi2Sr2CaCu2O8, LaNiO3, or their alloys.

5. The apparatus of claim 1, wherein the ferroelectric material includes one of:
Bismuth ferrite (BFO) with a doping material, wherein the doping material is one of Lanthanum, or elements from lanthanide series of periodic table;
Lead zirconium titanate (PZT), or PZT with a doping material, wherein the doping material is one of La or Nb;
a relaxor ferroelectric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
a perovskite which includes one of: BaTiO3, PbTiO3, KNbO3, or NaTaO3;
a hexagonal ferroelectric which includes one of: YMnO3 or LuFeO3;
hexagonal ferroelectrics of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
Hafnium (Hf), Zirconium (Zr), Aluminum (Al), Silicon (Si), their oxides or their alloyed oxides;
Hafnium oxides of a form, Hf1-x Ex Oy where E can be Al, Ca, Ce, Dy, Er, Gd, Ge, La, Sc, Si, Sr, Sn, or Y;
Al(1-x)Sc(x)N, Ga(1-x)Sc(x)N, Al(1-x)Y(x)N or Al(1-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction;
Niobate type compounds LiNbO3, LiTaO3, Lithium iron Tantalum Oxy Fluoride, Barium Strontium Niobate, Sodium Barium Niobate, or Potassium strontium niobate; or
an improper ferroelectric which includes one of: [PTO/STO]n or [LAO/STO]n, where 'n' is between 1 to 100.

6. The apparatus of claim 1, wherein the first dielectric comprises one of: SiO, SiOC, or SiOCN.

7. The apparatus of claim 1, wherein the first structure comprises one of: SiN, Al2O3, or ZrO.

8. The apparatus of claim 1, wherein the first, second, third, and fourth electrodes have a thickness in a range of 0.1 nm to 50 nm; and wherein the ESL has a thickness in a range of 0.1 nm to 50 nm.

9. The apparatus of claim 1, wherein the transistor is one of a CMOS, TFET, a gate all around transistor, planar transistor, or a non-planar transistor.

10. A system comprising:
a processor;
a communication interface communicatively coupled to the processor; and
a memory coupled to the processor, wherein the memory includes bit-cells, wherein one of the bit-cells includes:
a transistor;
an etch stop layer (ESL); and
a pillar capacitor coupled the transistor, wherein the pillar capacitor comprises:
a first electrode comprising a first conductive material, wherein the first electrode is substantially a U-shaped structure, wherein the U-shaped structure comprises a base portion and substantially vertical portions in contact with the base portion;
a first dielectric inside the U-shaped structure of the first electrode;
a first structure, separate and different from the first dielectric, wherein the first structure is adjacent to the first dielectric such that the first structure plugs the U-shaped structure, and wherein the first structure is laterally adjacent to first portions of the substantially vertical portions of the first electrode;
a second electrode comprising a second conductive material, the second electrode adjacent to second portions of the substantially vertical portions of the first electrode,
a ferroelectric material adjacent to the second electrode;
a third electrode adjacent to the ferroelectric material, wherein the third electrode includes a third conductive material; and
a fourth electrode adjacent to the third electrode, wherein the fourth electrode includes a fourth conductive material.

11. The system of claim 10, wherein the processor is one of an accelerator or an artificial intelligence (AI) processor.

12. The system of claim 10, wherein:
the ESL includes one or more of: Si, C, or N;
the first conductive material and the fourth conductive material includes one or more of: Ti, Ru, Cu, Co, Ta, W, TaN, or WN;
the second conductive material includes one of: SrO, IrO2, RuO2, PdO2, PsO2, ReO3, LaCoO3, SrCoO3, SrRuO3, LaMnO3, SrMnO3, YBa2Cu3O7, Bi2Sr2CaCu2O8, or LaNiO3;
the ferroelectric material includes one of:
Bismuth ferrite (BFO) with a doping material, wherein the doping material is one of Lanthanum, or elements from lanthanide series of periodic table;
Lead zirconium titanate (PZT), or PZT with a doping material, wherein the doping material is one of La or Nb;
a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
a perovskite which includes one of: BaTiO3, PbTiO3, KNbO3, or NaTaO3;
a hexagonal ferroelectric which includes one of: YMnO3 or LuFeO3;
hexagonal ferroelectrics of a type h-RMnO3, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
Hafnium (Hf), Zirconium (Zr), Aluminum (Al), Silicon (Si), their oxides or their alloyed oxides;
Hafnium oxides of a form, Hf1-x Ex Oy where E can be Al, Ca, Ce, Dy, Er, Gd, Ge, La, Sc, Si, Sr, Sn, or Y;
Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction;

Niobate type compounds LiNbO3, LiTaO3, Lithium iron Tantalum Oxy Fluoride, Barium Strontium Niobate, Sodium Barium Niobate, or Potassium strontium niobate; or an improper ferroelectric which includes one of: [PTO/STO]n or [LAO/STO]n, where 'n' is between 1 to 100;

the first dielectric comprises one of: SiO, SiOC, or SiOCN; and the first structure comprises: SiN, Al2O3, or ZrO.

* * * * *